US008665259B2

(12) United States Patent
McCrae et al.

(10) Patent No.: US 8,665,259 B2
(45) Date of Patent: *Mar. 4, 2014

(54) MULTISCALE THREE-DIMENSIONAL NAVIGATION

(75) Inventors: James McCrae, Toronto (CA); Igor Mordatch, Toronto (CA); Michael Glueck, Toronto (CA); Azam Khan, Aurora (CA)

(73) Assignee: Autodesk, Inc., San Rafael, CA (US)

( * ) Notice: Subject to any disclaimer, the term of this patent is extended or adjusted under 35 U.S.C. 154(b) by 981 days.

This patent is subject to a terminal disclaimer.

(21) Appl. No.: 12/425,000

(22) Filed: Apr. 16, 2009

(65) Prior Publication Data

US 2010/0265248 A1    Oct. 21, 2010

(51) Int. Cl.
*G06T 15/00* (2011.01)
(52) U.S. Cl.
USPC ........... 345/419; 345/420; 345/427; 345/428; 345/473; 345/474; 345/958; 715/850; 382/154
(58) Field of Classification Search
USPC .......... 345/419, 420.427, 428, 473, 474, 958, 345/427; 715/850; 382/154
See application file for complete search history.

(56) References Cited

U.S. PATENT DOCUMENTS

| 6,204,850 | B1 * | 3/2001 | Green | 715/850 |
| 6,240,361 | B1 * | 5/2001 | Ise et al. | 701/431 |
| 6,346,938 | B1 * | 2/2002 | Chan et al. | 345/419 |
| 7,199,793 | B2 * | 4/2007 | Oh et al. | 345/419 |
| 7,256,779 | B2 | 8/2007 | Donnelly | |
| 7,596,530 | B1 | 9/2009 | Glasberg | |
| 7,596,536 | B2 * | 9/2009 | Tzruya et al. | 706/45 |
| 7,606,375 | B2 * | 10/2009 | Bailey et al. | 381/63 |
| 8,249,264 | B2 * | 8/2012 | Bailey et al. | 381/63 |
| 2008/0147315 | A1 * | 6/2008 | Fetzmann et al. | 701/207 |
| 2009/0259976 | A1 * | 10/2009 | Varadhan et al. | 715/850 |
| 2009/0319166 | A1 | 12/2009 | Khosravy et al. | |
| 2009/0319348 | A1 * | 12/2009 | Khosravy et al. | 705/14.1 |
| 2011/0074770 | A1 * | 3/2011 | Robinson et al. | 345/419 |

OTHER PUBLICATIONS

McCrae et al. "Multiscale 3D Navigation", Published Feb. 27-Mar. 1, 2009.*
Abasolo, et al. "Magallanes: 3D Navigation for Everybody", In Graphite '07: Proceedings of the 5$^{th}$ international conference on Computer graphics and interactive techniques in Australia and Southeast Asia, ACM, New York, NY, USA, 135-142. 2007.

(Continued)

*Primary Examiner* — Kimbinh T Nguyen
(74) *Attorney, Agent, or Firm* — Patterson & Sheridan, LLP

(57) ABSTRACT

One embodiment of the present invention sets forth a technique for providing an end user with a multiscale three-dimensional (3D) navigation experience in design software application programs. An adaptive multiscale 3D navigation system allows an end user to transition between a planetary scale down to an individual building scale. The end user may navigate within the building, inspecting object details within the building. The size of the environment is sensed automatically, and the viewing and travel parameters are adjusted accordingly to provide the end user with a seamless navigation experience. A consistent navigation experience is supported at various scales, and real-time collision detection is provided. Scale computation for 3D scenes and collision detection may be based on a generated depth cubemap of the environment.

24 Claims, 15 Drawing Sheets

(56) References Cited

OTHER PUBLICATIONS

Baciu, et al. "Rendering in Object Interference Detection on Conventional Graphics Workstations", In PG '97: Proceedings of the 5th Pacific Conference on Computer Graphics and Applications, IEEE Computer Society, Washington, DC, USA, 51-58. 1997.
Baciu, et al. "Recode: An Image-Based Collision Detection Algorithm", Computer Graphics and Applications, Pacific Conference on 0, 125-133. 1998.
Balakrishnan, et al. "Exploring Bimanual Camera Control and Object Manipulation in 3D. Graphics Interfaces", In CHI '99: Proceedings of the SIGCHI conference on Human factors in computing systems, ACM, New York, NY, USA, 56-62. 1999.
Bares, et al. "Intelligent Multi-Shot Visualization Interfaces for Dynamic 3D Worlds", In Iui '99: Proceedings of the 4th international conference on Intelligent user interfaces, ACM, New York, NY, USA, 119-126. 1999.
Bares, et al. "Virtual 3D Camera Composition from Frame Constraints", In Multimedia '00: Proceedings of the eighth ACM international conference on Multimedia, ACM, New York, NY, USA, 177-186. 2000.
Burtnyk, et al. "StyleCam: Interactive Stylized 3D Navigation using Integrated Spatial & Temporal Controls", In UIST '02: Proceedings of the 15th annual ACM symposium on User interface software and technology, ACM, New York, NY, USA, 101-110. 2002.
Burtnyk, et al. "ShowMotion—Camera Motion based 3D Design Review", In I3D '06: Proceedings of the 2006 symposium on Interactive 3D graphics and games, ACM, New York, NY, USA, 167-174. 2006.
Cohen, et al. "Harold: A World Made of Drawings", In NPAR '00: Proceedings of the 1st international symposium on Non-photorealistic animation and rendering, ACM, New York, NY, USA, 83-90. 2000.
Darken, et al. "A Toolset for Navigation in Virtual Environments", In UIST '93: Proceedings of the 6th annual ACM symposium on User interface software and technology, ACM, New York, NY, USA, 157-165. 1993.
Dos Santos, et al. "Metaphor-Aware 3D Navigation", In INFOVIS '00: Proceedings of the IEEE Symposium on Information Visualization 2000, IEEE Computer Society, Washington, DC, USA, 155. 2000.
Drucker, et al. "CamDroid: A System for Implementing Intelligent Camera Control", In SI3D '95: Proceedings of the 1995 symposium on Interactive 3D graphics, ACM, New York, NY, USA, 139-144. 1995.
Elmqvist, et al. "Evaluating Motion Constraints for 3D Wayfinding in Immersive and Desktop Virtual Environments", In CHI '08: Proceeding of the twenty-sixth annual SIGCHI conference on Human factors in computing systems, ACM, New York, NY, USA, 1769-1778. 2008.
Fan, et al. "Simple and Rapid Collision Detection using Multiple Viewing Volumes", In VRCAI '04: Proceedings of the 2004 ACM SIGGRAPH international conference on Virtual Reality continuum and its applications in industry, ACM, New York, NY, USA, 95-99. 2004.
Fitzmaurice, et al. "Tracking Menus", In UIST '03: Proceedings of the 16th annual ACM symposium on User interface software and technology, ACM, New York, NY, USA, 71-79. 2003.
Fitzmaurice, et al. "Safe 3D Navigation", In SI3D '08: Proceedings of the 2008 symposium on Interactive 3D graphics and games, ACM, New York, NY, USA, 7-15. 2008.
Tinsley Galyean. "Guided Navigation of Virtual Environments", In SI3D '95: Proceedings of the 1995 symposium on Interactive 3D graphics, ACM, New York, NY, USA, 103-104, 210. 1995.
Gleicher, et al. "Through-the-Lens Camera Control", In SIGGRAPH '92: Proceedings of the 19th annual conference on Computer graphics and interactive techniques, ACM, New York, NY, USA, 331-340. 1992.
Haik, et al. "Investigation into Effective Navigation in Desktop Virtual Interfaces", In Web3D '02: Proceedings of the seventh international conference on 3D Web technology, ACM, New York, NY, USA, 59-66. 2002.
Hanson, et al. "Constrained 3D Navigation with 2D Controllers", In VIS '97: Proceedings of the 8th conference on Visualization '97, IEEE Computer Society Press, Los Alamitos, CA, USA, 175-182. 1997.
Hanson, et al. "Constrained Navigation Environments", IEEE Computer Society, Los Alamitos, CA, USA, vol. 0,95-104. 1997.
Hoaglin, et al. "Understanding Robust and Exploratory Data Analysis", John Wiley & Sons, Inc. 2000.
Igarashi, et al. "Path Drawing for 3D Walkthrough", In UIST '98: Proceedings of the 11th annual ACM symposium on User interface software and technology, ACM, New York, NY, USA, 173-174. 1998.
Jul, et al. "Critical Zones in Desert Fog: Aids to Multiscale Navigation", In UIST '98: Proceedings of the 11th annual ACM symposium on User interface software and technology, ACM, New York, NY, USA, 97-106. 1998.
Khan, et al. "HoverCam: Interactive 3D Navigation for Proximal Object Inspection", In I3D '05: Proceedings of the 2005 symposium on Interactive 3D graphics and games, ACM, New York, NY, USA, 73-80. 2005.
Khan, et al. "ViewCube: A 3D Orientation Indicator and Controller", In SI3D '08: Proceedings of the 2008 symposium on Interactive 3D graphics and games, ACM, New York, NY, USA, 17-25. 2008.
Kolb, et al. "Hardware-based Simulation and Collision Detection for Large Particle Systems", In HWWS '04: Proceedings of the ACM SIGGRAPH/EUROGRAPHICS conference on Graphics hardware, ACM, New York, NY, USA, 123-131. 2004.
Li, et al. "Improving Navigation Efficiency with Artificial Force Field", In Proceedings of 2001 14th IPPR Conference on Computer Vision, Graphics, and Image Processing. 1-7. 2001.
Li, et al. "An Intelligent 3D User Interface Adapting to User Control Behaviors", In IUI '04: Proceedings of the 9th international conference on Intelligent user interfaces, ACM, New York, NY, USA, 184-190. 2004.
Li, et al. "An Intelligent User Interface with Motion Planning for 3D Navigation", In VR '00: Proceedings of the IEEE Virtual Reality 2000 Conference, IEEE Computer society, Washington, DC, USA. 2000.
Mackinlay, et al. "Rapid Controlled Movement Through a Virtual 3D Workspace", In SIGGRAPH '90: Proceedings of the 17 annual conference on Computer graphics and interactive techniques, ACM, New York, NY, USA, 171-176. 1990.
Myszkowski, et al. "Fast Collision Detection Between Complex Solids Using Rasterizing Graphics Hardware", The Visual Computer 11(9), 497-511. 1995.
Ropinski, et al. "A Constrained Road-Based VR Navigation Technique for Travelling in 3D City Models", In ICAT '05: Proceedings of the 2005 international conference on Augmented tele-existence, ACM, New York, NY, USA, 228-235. 2005.
Salomon, et al. "Interactive Navigation in Complex Environments Using Path Planning", In I3D '03: Proceedings of the 2003 symposium on Interactive 3D graphics, ACM, New York, NY, USA. 2003.
Steed, et al. "Efficient Navigation Around Complex Virtual Environments", In VRST '97: Proceedings of the ACM symposium on Virtual reality software and technology, ACM, New York, NY, USA, 173-180. 1997.
Tan, et al. "Exploring 3D Navigation: Combining Speed-coupled Flying with Orbiting", In CHI '01: Proceedings of the SIGCHI conference on Human factors in computing systems, ACM New York, NY, USA, 418-425. 2001.
Vassilev, et al. "Fast Cloth Animation on Walking Avatars". 2001.
Ware, et al. "Context Sensitive Flying Interface", In SI3D '97: Proceedings of the 1997 symposium on Interactive 3D graphics, ACM, New York, NY, USA. 1997.
Ware, et al. "Exploration and Virtual Camera Control in Virtual Three Dimensional Environments", In SI3D '90: Proceedings of the 1990 symposium on Interactive 3D graphics, ACM, New York, NY, USA, 175-183. 1990.
Winter, et al. "Depth-Buffer based Navigation", Stanford, USA, Nov. 16-18, 2004.
Xiao, et al. "Navigation Guided by Artificial Force Fields", In CHI '98: Proceedings of the SIGCHI conference on Human factors in computing systems, ACM Press/Addison-Wesley Publishing Co., New York, NY, USA, 179-186. 1998.

* cited by examiner

MULTISCALE THREE-DIMENSIONAL NAVIGATION

BACKGROUND OF THE INVENTION

1. Field of the Invention

Embodiments of the present invention relate generally to a three-dimensional (3D) authoring application interface and, more specifically, to multiscale 3D navigation.

2. Description of the Related Art

As computers continue to grow in processing and storage capacity, users create ever larger data sets that include both large structures as well and smaller scale detailed elements. A particularly compelling large multiscale data set is the Earth and the geospatial information of human activity, including global political boundaries, roads, and motorways, and buildings. With the advent of Google Earth™ and Microsoft Virtual Earth™, 3D urban visualization and navigation has become mainstream.

There are several scales at which urban environments can be meaningful to users—those at the city scale, at the neighborhood scale, at the street level scale, at a scale of a single building or home, and at the scale of a single apartment or room inside of a structure. However, typical 3D software applications do not account for the scale of the environment within their navigation tools. Some applications simply do not provide a means for users to modify the navigation tools in the ways needed to support multiscale navigation. Applications that do allow an end user to control navigation tools, typically bury the control options in several layers of dialog boxes. Users need to continuously manually modify the settings as the scale of the environment changes, adding significant effort to the end users task.

As the foregoing illustrates, what is needed in the art is a technique for providing users with an adaptive multiscale navigation experience in 3D application programs.

SUMMARY OF THE INVENTION

One embodiment of the present invention sets forth a method for providing a multiscale three-dimensional (3D) navigation environment. The method includes the steps of obtaining a set of distance values indicating distances between a camera and at least one closest fragment of associated with one or more geometric objects in a 3D scene environment and computing a scale for the 3D scene environment based on the set of distance values, where the scale indicates a relationship between a control unit of the 3D scene environment and a display unit of a rendered frame. The 3D scene environment is rendered, as viewed from the camera, to produce a rendered frame and the rendered frame is stored in a memory or displayed on a display device.

One advantage of the disclosed method is that it provides users with multiscale 3D navigation experience with adaptive scale detection. The size of the environment is sensed automatically, and the viewing and travel parameters are adjusted accordingly to provide the end user with a seamless navigation experience. The end user workflow is simplified and more intuitive, thereby improving the overall end user experience.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details. In other instances, well-known features have not been described in order to avoid obscuring the present invention.

Figure 1:
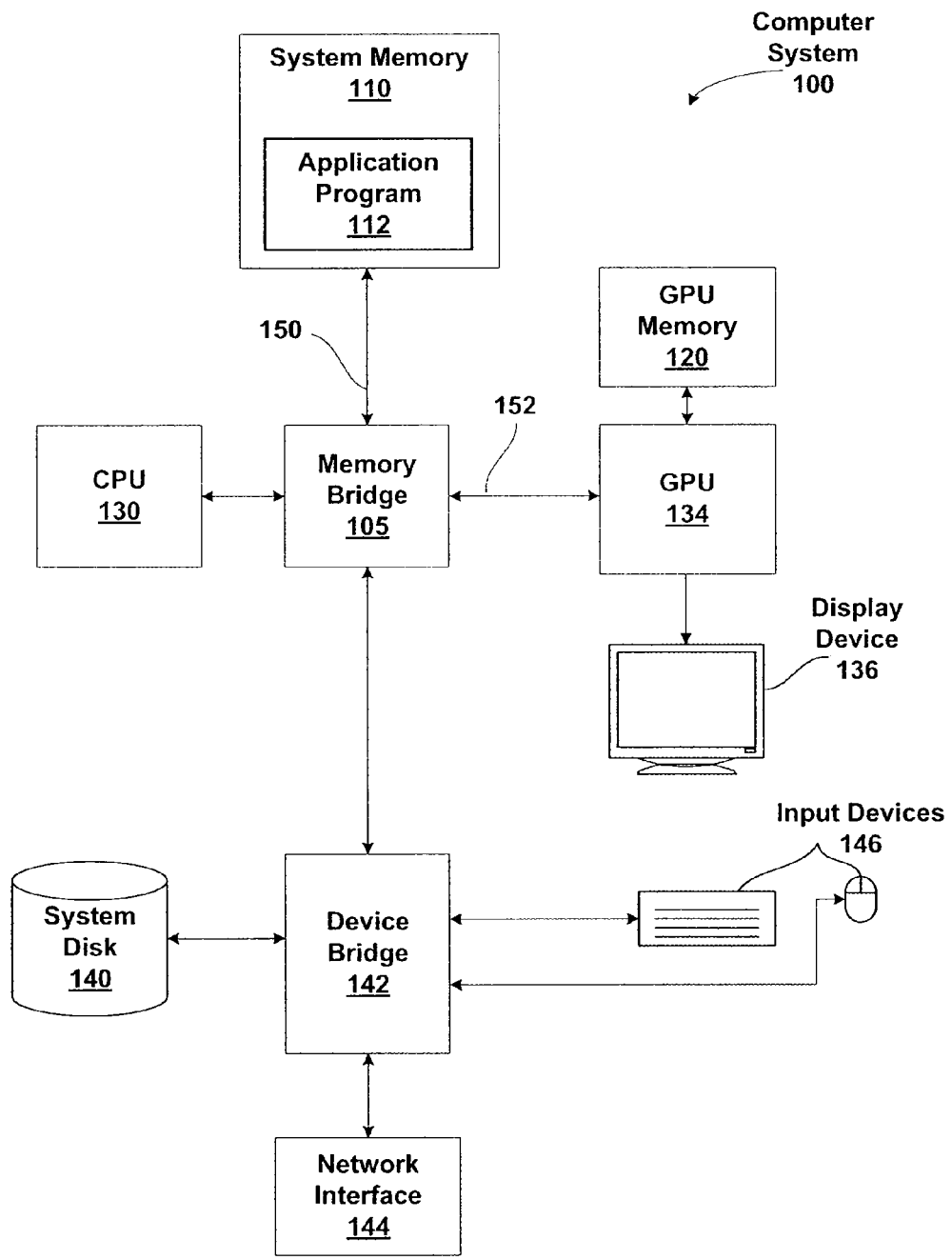
FIG. 1 illustrates a computer system configured to implement one or more aspects of the present invention.

FIG. 1 illustrates a computer system 100 configured to implement one or more aspects of the present invention. The computer system 100 includes, without limitation, a central processing unit (CPU) 130, a system memory 110, a graphics processing unit (GPU) 134, a GPU memory 120, a memory bridge 105, a display device 136, a system disk 140, a device bridge 142, a network interface 144, a mouse 146, and input devices 146.

The CPU 130 communicates with the system memory 110 via the memory bridge 105, which may be, e.g., a Northbridge device or subsystem. System memory 110 is configured to store application programs, as well as data used by or generated by the CPU 130. System memory 110 is coupled to the memory bridge 105 via a system memory bus 150. The memory bridge 105 is coupled to the GPU 134 via a GPU system bus 152. The GPU system bus 152 may comprise any technically feasible data interconnect, such as the well known personal computer interconnect (PCI) express bus. The memory bridge 105 is also coupled to the device bridge 142 using an interconnect system such as PCI. The GPU 134 conventionally incorporates real time image rendering means for rendering both three-dimensional (3D) and two-dimensional (2D) images. The GPU 134 delivers pixel data to display device 136, which may comprise a conventional CRT or LCD display. The GPU 134 is coupled to the GPU memory 120 using a GPU memory bus 154. The GPU memory 120 may be configured to store data used by or generated by the GPU 134. Data stored within the GPU memory 120 passes through the GPU 134 and the memory bridge 105 when accessed by the CPU 130. In some embodiments, the integrated circuit implementing the CPU 130 may incorporate additional functional blocks, such as the memory bridge 105 and the device bridge 142. In alternative embodiments, the integrated circuit implementing the GPU 134 may incorporate additional functional blocks, such as the memory bridge 105 and the device bridge 142.

The device bridge 142 is coupled to a hard drive 140, a network interface 144, a mouse 146, and input devices 146. The hard drive 140 provides mass storage of programs and data. The network interface 144 provides network connectivity to other computers using a local area network (LAN) interface using any suitable technology, such as Ethernet. The mouse 146 and input devices 146 provide user input. Other components (not explicitly shown), including USB or other port connections, CD drives, DVD drives, film recording devices, and the like, may also be connected to I/O bridge 107. Communication paths interconnecting the various components in FIG. 1 may be implemented using any suitable protocols, such as PCI (Peripheral Component Interconnect), PCI Express (PCI-E), AGP (Accelerated Graphics Port), HyperTransport, Quick Path Interconnect, or any other bus or point-to-point communication protocol(s), and connections between different devices may use different protocols as is known in the art.

In one embodiment, system memory 110 is configured to store a graphics modeling or authoring application program 112 that is configured to provide multiscale 3D navigation features. System memory 110 an/or GPU memory 120 may be configured to store a plurality of frame buffers 118, which may be configured to store scenes rendered by GPU 134. The scenes may be displayed on display device 136.

Many application programs rely on CPU 130 to perform geometric processing as an end user navigates about an environment. When a scene is more complex, this approach will typically not provide the end user with an interactive experience. GPU 134 or CPU 130 may be used to rasterize the environment geometry into a compact image-based representation that is a depth cubemap. Each image-space position maps to a 3D vector that points out into the scene from a camera. The value stored at each image-space position in the depth cubemap defines the distance to environment geometry in one of the six axis-aligned directions.

Figure 2A:
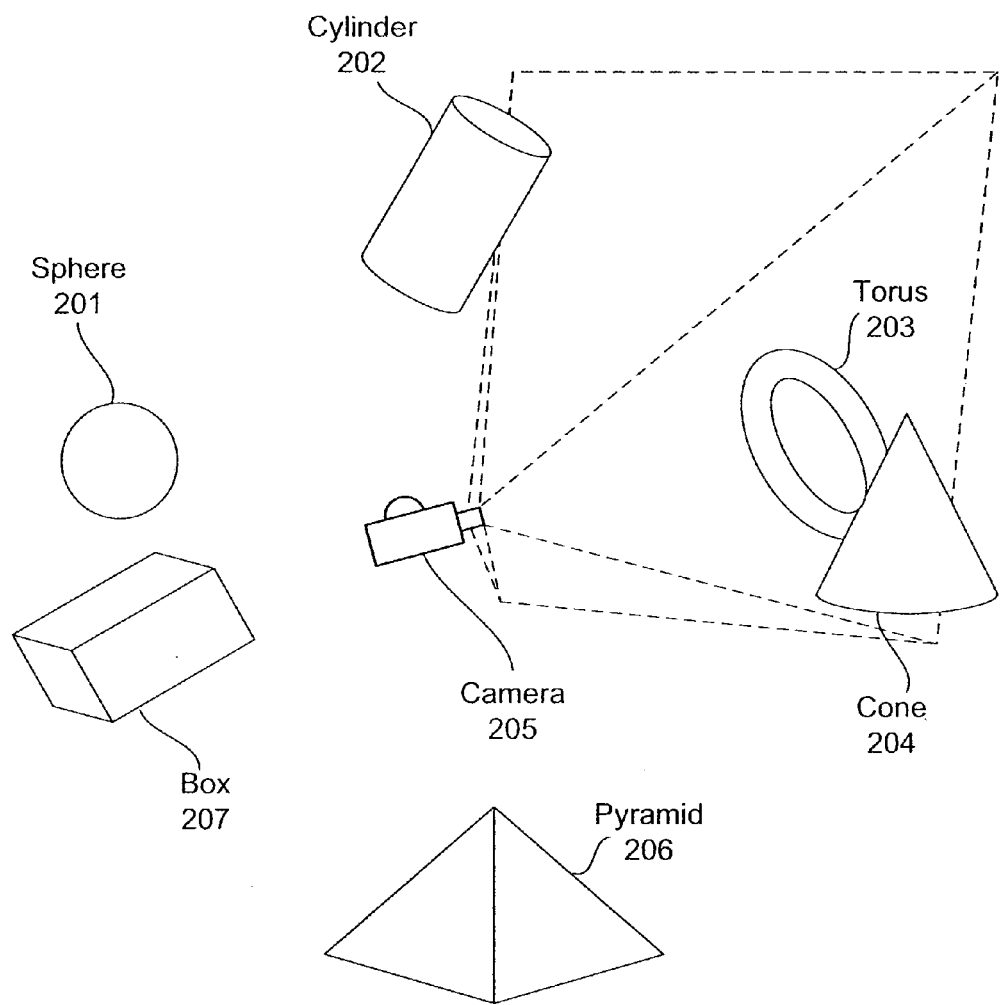
FIG. 2A illustrates scene geometry and a camera configured to capture an axis-aligned face of a depth cubemap, according to one embodiment of the invention.

FIG. 2A illustrates scene geometry and a camera 205 that is configured to capture an axis-aligned face of a depth cubemap, according to one embodiment of the invention. The camera 205 is aligned along one of three axes in the scene, the positive x-axis, and has a 90 degree field of view. The scene includes several geometric objects, e.g., a sphere 201, a cylinder 202, a torus 203, a cone 204, a pyramid 206, and a box 207. The torus 203 is positioned within a viewing frustum projected from the camera 205 and appears within a projection plane that corresponds to a face of the depth cubemap. Therefore, distance values of one or more fragments of the torus 203 are stored in the face of the depth cubemap corresponding to the positive x-axis for the scene. The number of distance values that are associated with fragments of the torus 203 depends on the sampling rate that is used to generate the depth cubemap (or depth cubemap sample resolution). The normal vector corresponding to the distance values are implicit since the normal vector opposes the axis of the depth cubemap face that each distance value is stored in.

Figure 2B:
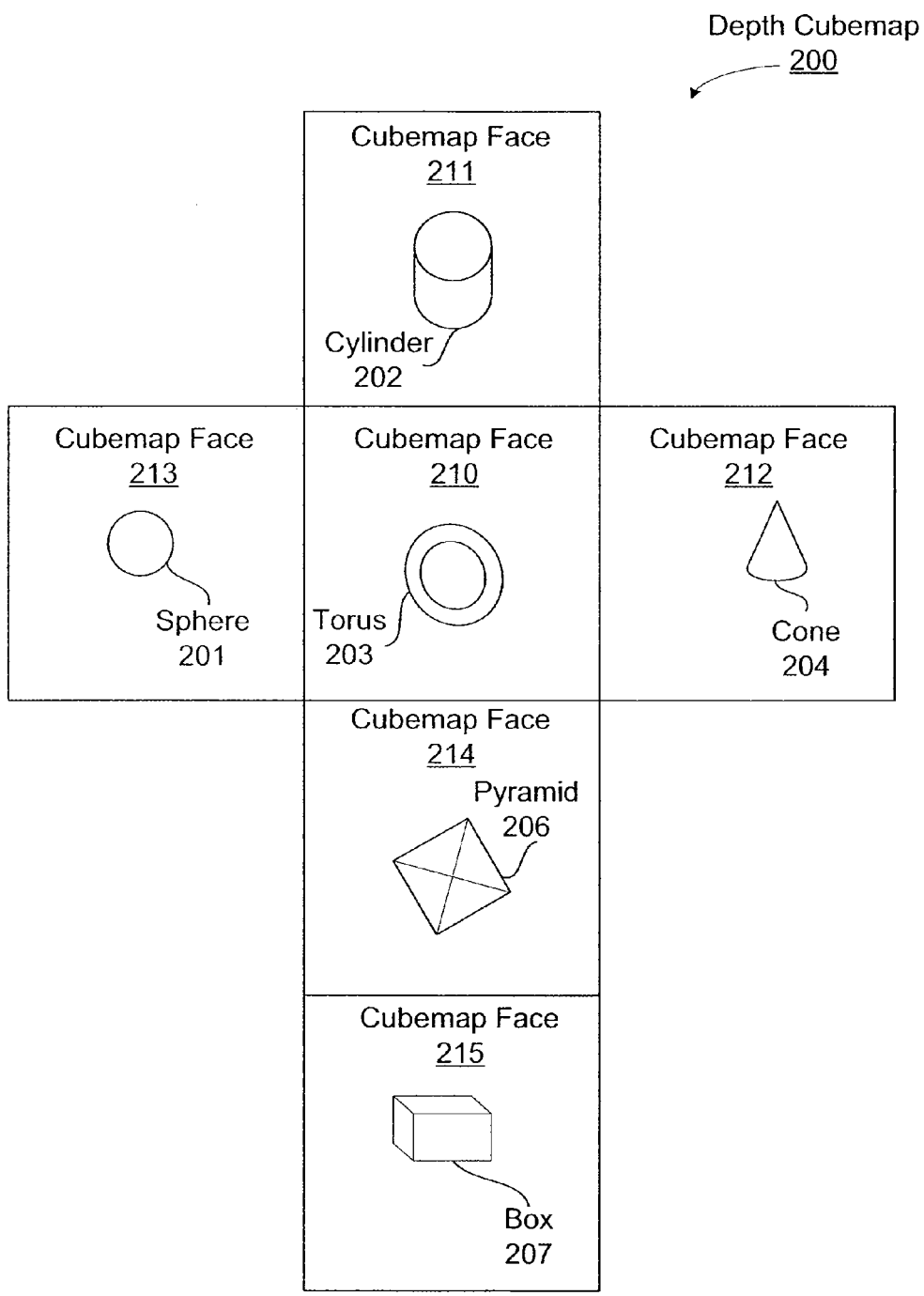
FIG. 2B illustrates a depth cubemap of the scene geometry, according to one embodiment of the invention.

FIG. 2B illustrates a depth cubemap 200 of the scene geometry, according to one embodiment of the invention. The depth cubemap 200 includes six faces corresponding to the positive and negative directions of the x, y, and z axis. The scene is rendered from the camera 205 viewpoint to produce depth cubemap faces 210, 211, 212, 213, 214, and 215, corresponding to the positive x-axis, positive y-axis, positive z-axis, negative z-axis, negative y-axis, and negative x-axis, respectively.

The geometric objects in the environment may be rendered using a shader that is executed by CPU 130 or GPU 134 to calculate the distance to the camera 205 for each fragment that is sampled. Each fragment is a unique position in the image-based representation. Distances are normalized by the current viewing frustum near and far plane distance and the closest distance for each sample of the scene is stored. The distance d is used as the distance component in the image for each fragment. In some embodiments of the invention, distances of fragments that are transparent or otherwise not visible are not stored in the depth cubemap. An alpha threshold may be used to discard or accept fragments during the generation of depth cubemap. Treating transparent or semi-transparent objects as "invisible" will allow the camera to travel through those objects when collision avoidance is enabled. Similarly, specific geometric objects, such as a ground plane may be excluded during generation of the depth cubemap.

To be shown visually, a color component (red, green, blue) may be set to 1.0-d to indicate the closeness to the camera 205. The depth cubemap 200 provides a histogram of distance and normal vector information for the scene. The set of distance values stored in the depth cubemap may be used to dynamically determine a scale of the environment and a control-display (C:D) ratio for manipulation and collision avoidance. The scale indicates a relationship between a control unit of the 3D scene environment, e.g., input device movement, and a display unit, e.g., pixel, of a rendered frame. For example a control unit of a millimeter may correspond to a display unit of 100 pixels or a control unit of five centimeters may correspond to a display unit of 10 pixels.

The combined frusta of the six different orientations of camera 205 completely cover the scene space until all of the clipping limits meet. The worldspace position of the pixel (x, y) ranges between −1 and +1, inclusive, in one of the six cubemap sub-images, and can be recovered using the following equation:

$$\text{pos}(x,y,i) = \text{dist}(x,y,i) \cdot \text{norm}(\text{front}(i) | \text{right}(i)x | \text{up}(i)y). \quad \text{Equation 1}$$

Front, right, and up are unit vectors whose directions correspond to the projection for face i of the depth cubemap 200. Note that only the worldspace position of the camera 205, not the orientation of the camera 205, is needed to update the depth cubemap 200. Fixed vectors are used for front, right, and up, such that the faces unwrap to form a cube whose front face is always oriented towards the positive x-axis, as shown in FIG. 2B.

The depth cubemap 200 can be updated at every frame, when camera 205 moves, or when the geometric objects in the scene change position, are modified, or are inserted or deleted. The depth cubemap does not require pre-computation, or maintenance of any additional data structures. This is an important property for environments that are dynamic or are in the process of being authored. Since applications of the depth cubemap 200 use samples to estimate a single statistic or average multiple samples, it is not necessary to render high-resolution (in terms of the number of distance samples) depth cubemap faces, or use highly-detailed geometry to produce the depth cubemap 200. The depth cubemap faces may be stored as a texture map.

Generally, the sampling resolution of a geometric object at a distance d from the camera 205 is 2d/cubeMapResolution. A 64×64 sample size (cubeMapResolution) for each face of the depth cubemap 200 provides an effective resolution of ten centimeters for objects 2.3 meters away from the camera 205. The depth cubemap 200 is used to enable consistent navigation at various scales as well as real-time collision detection without pre-computation or prior knowledge of geometric structure.

In navigation tools that use some notion of absolute speed (such as a walk tool), it is desirable for speed to be related to environment size. In some applications, the scale of the environment is generally uniform and known, so speed parameters can be hand-tuned to match the known scale. However, scale of the environment may not always be known or may vary greatly across the environment. In such situations, distance values stored in the depth cubemap 200 may be used to estimate the scale of the local environment. Speed parameters may then be modulated using the scale estimates. As an end user zooms in from a global view to viewing a specific building, the scale is sensed and the C:D ratio is dynamically modified so that each increment of the cursor or camera corresponds to a progressively smaller increment in pixels. The speed of the camera slows as the distance to objects in the scene is reduced and the speed of the camera increases as the distance to objects in the scene increases. As the end user zooms in even closer to enter a building and examine details within the building, such as a photo or a clock, or even smaller objects, the scale of the environment is dynamically detected and the C:D ratio is adjusted accordingly. Conversely, as an end user zooms out within a scene, the scale of the environment is also detected, and the C:D ratio is adjusted. The dynamic determination of the scale and adjustment of the C:D ratio provide the end user with an adaptive navigation experience that is intuitive. In contrast, most conventional systems use a fixed scale. Some conventional system allow the end user manually change the scale.

Figure 3:
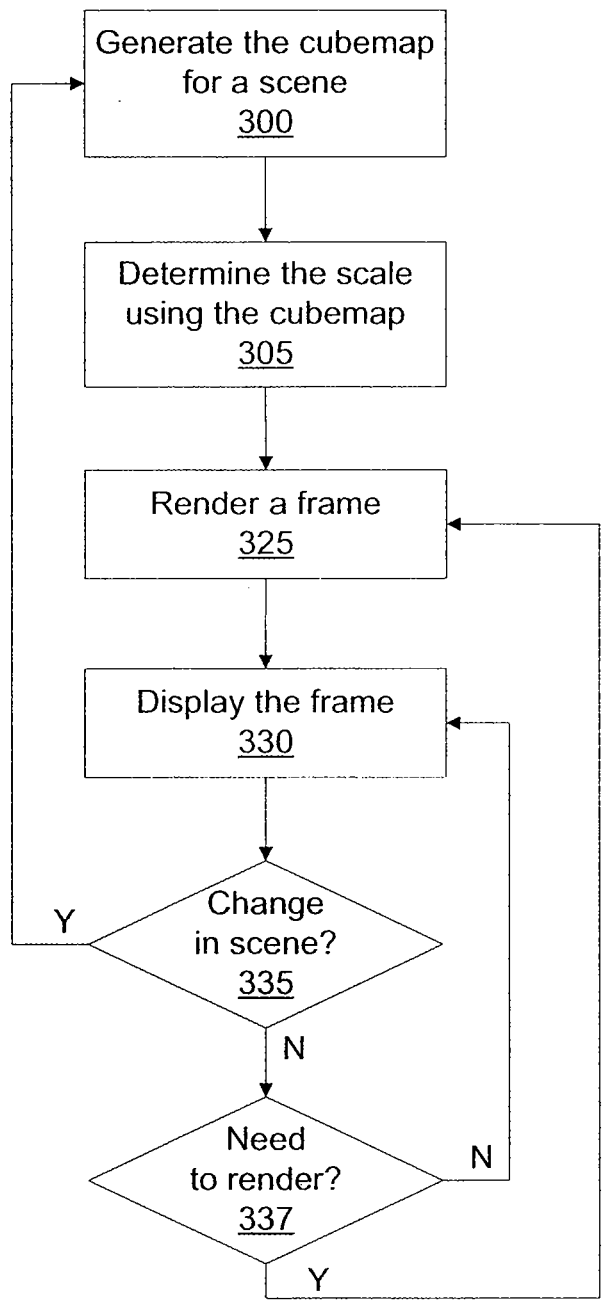
FIG. 3 illustrates is a flow diagram of method steps for generating and using a depth cubemap to render and display a frame, according to one embodiment of the invention.

FIG. 3 illustrates is a flow diagram of method steps for generating and using a depth cubemap to render and display a frame, according to one embodiment of the invention. Although the method steps are described in conjunction with the system of FIG. 1, persons skilled in the art will understand that any system configured to perform the method steps, in any order, is within the scope of the invention.

The method begins in step 300, where the depth cubemap for a scene is determined. In step 305, the application program 112 determines the scale for the scene using the depth cubemap. As the distance between the viewpoint and an object changes, it may be necessary to change the scale. A navigation operation such as translating from side to side using an input device occurs at fixed increments in relation to the input device movement. The increment ratio may be adjusted so that movements of the input device correspond to smaller incremental movements in the object when the viewing distance is reduced and movements of the input device correspond to larger incremental movements in the object when the viewing distance is increased.

The scale may be determined based on the minimum distance stored in the depth cubemap. For example, assuming a translation speed of s and an object distance d (provided by the depth cubemap), a linear relationship between s and d is expressed as s=cd, where c is a constant. This provides acceptable navigation behaviour for a multitude of environments and scales, especially when there is little or no prior knowledge of the environment geometry. Another technique for determining the scale uses the mean of all distance values in the depth cubemap as a scale estimate. The mean may include some distance samples that are outliers, resulting from open windows or doors and therefore, may produce less predictable navigation behaviour compared with using the minimum distance.

In step 325, the scene is rendered to produce a frame, and, in step 330 the frame is displayed. In step 335, the application program 112 determines if the scene has changed in manner that necessitates recomputation of the depth cubemap. For example, the camera position may have changed or an object in the scene may have moved, changed geometrically, been inserted, or been deleted. If, in step 335 the application program 112 determines that the scene has changed in a manner that necessitates recomputation of the depth cubemap, then the application program 112 returns to step 300. Otherwise, in step 337 the application program 112 determines if the scene needs to be rendered due to a non-geometric change, e.g., color, texture, lighting, and the like. If, in step 337 the application program 112 determines that the scene does not need to be rendered, then the application program returns to step 330 to display the same frame. Otherwise, the application program 112 returns to step 325.

Although determination of the scene scale is described as using distance values provided by the depth cubemap, the scene scale may be determined using distance values provided using a different technique. Importantly, an adaptive multiscale 3D navigation system allows an end user to seamlessly transition between different scales, e.g., a planetary scale and an individual building scale. The size of the scene environment is sensed automatically and the viewing and travel parameters (C:D ratio) are adjusted accordingly to provide the end user with an intuitive navigation experience.

Proxy objects with lower geometric detail may be employed to represent geometric objects in scenes to improve the performance of producing the depth cubemap or to produce distance values using a different technique. Examples of proxy objects include primitives such as a sphere, cylinder, box, capsule, and the like. When loading each geometric object into a scene, the dimensions of the proxy object may be automatically calculated using the geometric object's vertex data. Benefits of using proxy objects include producing a depth cubemap yielding similar, if not equivalent scale detection and collision avoidance results compared with a depth cubemap produced using the actual geometric objects, while consuming fewer CPU or GPU processing cycles. Alternatively, the depth cubemap may be produced by a lower performance CPU or GPU when proxy objects are employed. The nearest point on the proxy object primitive can also be identified to enable specific navigation behaviours with a proxy object without the need to update the depth cubemap. Coarse-level collision detection can also be performed using the proxy objects.

The depth cubemap or other source of distance values may be used to determine which geometric objects may be represented by proxy objects for rendering a subsequent frame. This determination can be performed frame-to-frame to replace proxy objects with the actual geometry for objects that are close to the camera and insert a proxy objects in place of the actual geometry for objects that are further from the camera.

Proxy objects may also be used to control the behaviour of a 3D cursor. When a 3D cursor is used in a scene, the 3D cursor can be positioned to sit on the surface of geometry objects in the scene with an orientation that is on a plane perpendicular to the surface normal. A geometric object that is further from the camera relative to other geometric objects in the scene may cause the 3D cursor to erratically orient in different directions when the geometric object has a surface with normal vectors that vary in direction and the 3D cursor is moved across the surface of the geometric object. By using a proxy object, the 3D cursor orientation remains consistent, thereby improving the end user experience.

An "up" vector is used to provide the end user with an intuitive experience by controlling the roll parameter of the camera. Each independent scene has its won unique origin and coordinate frame. When a geometric object is imported into the scene it is assumed to be oriented so that its vertical direction points along the positive y-axis. The influence of a geometric object's up vector is based on the object's proximity to the camera. In the case of the Earth, the camera points to the North Pole when the camera is at an orbit-level scale in the scene. When the camera is close to the Earth the camera points toward the surface of the Earth. As the camera moves closer to the surface of the Earth, the up vector direction gradually changes from pointing to the North Pole to point normal to the Earth's surface.

Collision Detection and Avoidance

Figure 4A:
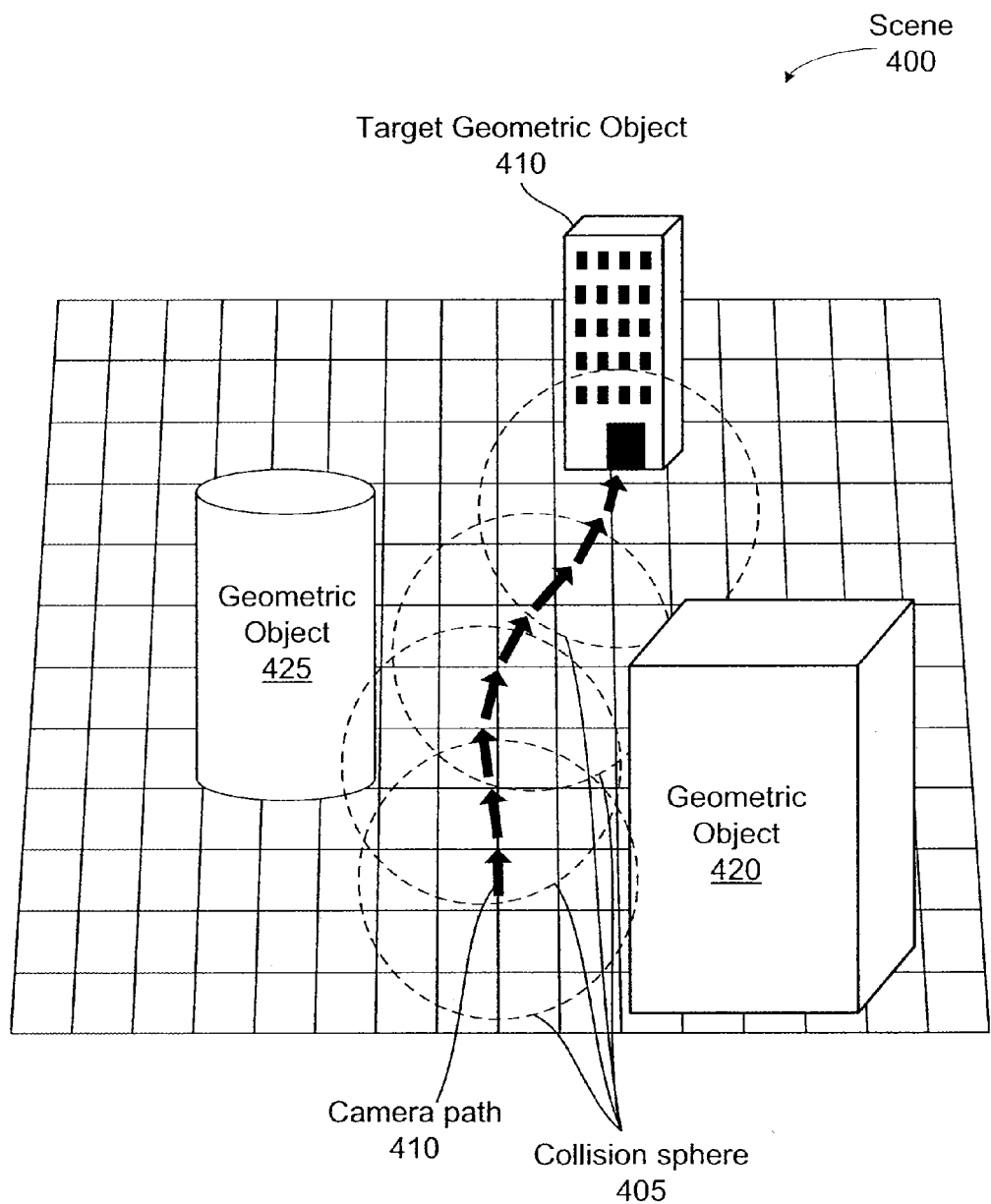
FIG. 4A illustrates a camera path that is automatically modified to avoid collisions with nearby geometry, according to one embodiment of the invention.

Distance values stored in the depth cubemap or provided by some other technique, may also be used to perform collision detection and avoidance. FIG. 4A illustrates a camera path 410 that is automatically modified to avoid collisions with nearby geometry, according to one embodiment of the invention. The depth cubemap may be used to prevent the camera from colliding with geometric objects in the environment of scene 400, without impacting performance of the system compared with using conventional geometric collision detection techniques. For every distance value in the depth cubemap that is within a threshold, δ, of the camera, a collision penalty force is applied to the camera in the direction of a vector pointing from the object to the camera. The camera's effective collision boundary is a sphere with a radius δ, e.g., collision sphere 401. As shown in FIG. 4A, a camera path 410 progresses toward a destination target, geometric object 430, while avoiding collisions with geometric objects 420 and 425.

Figure 4B:
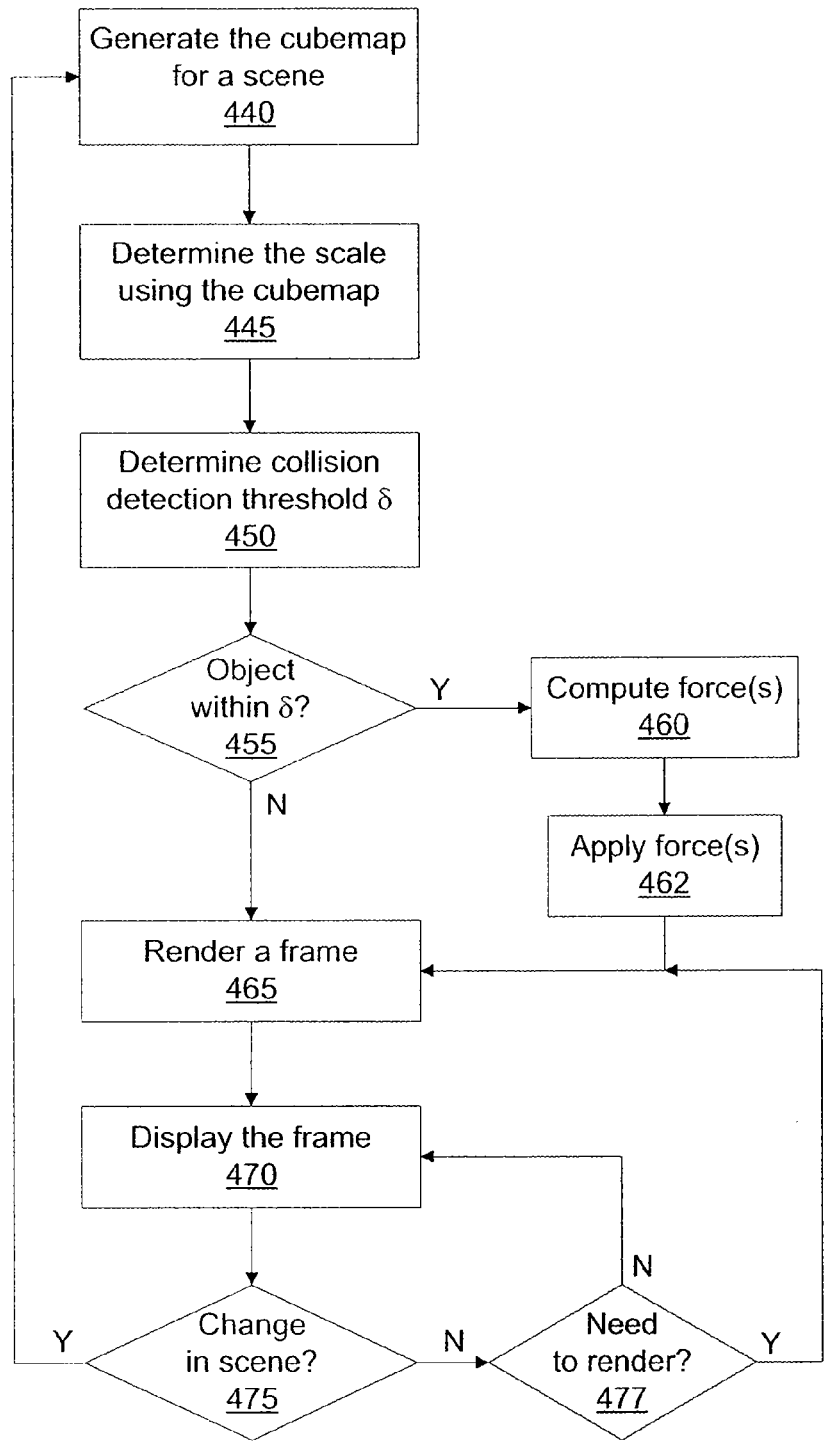
FIG. 4B illustrates is another flow diagram of method steps for generating and using a depth cubemap to render and display a frame, according to one embodiment of the invention.

FIG. 4B illustrates is a flow diagram of method steps for generating and using a depth cubemap to perform collision avoidance, according to one embodiment of the invention. Although the method steps are described in conjunction with the system of FIG. 1, persons skilled in the art will understand that any system configured to perform the method steps, in any order, is within the scope of the invention.

The method begins in step 440, where the depth cubemap for scene 400 is determined. In step 445, the application program 112 determines the scale of the scene environment for the scene 400 using the depth cubemap or using distance values acquired using a different technique. In step 450, the application program 112 determines the collision detection threshold δ for the camera so that geometry that is near the camera disturbs the camera's path. In step 455, the application program 112 determines if any of the distance values stored in the depth cubemap are within the collision detection threshold. If, in step 455 no distance values are within the collision detection threshold, then the application program 112 proceeds directly to step 465. Otherwise, the application program 112 computes a weighted sum of forces for one or more distance values to produce a net penalty force.

The net penalty force is a weighted sum of the force contributed by each distance value that is within the collision detection threshold. The following equation may be used to compute the net penalty force:

$$\frac{1}{N_x N_y 6} \sum_{x,y,i} w(dist(x, y, i) \cdot norm(pos(x, y, i) - \text{camera}). \quad \text{Equation 2}$$

W(dist) is a soft penalty function where sign is the direction of the axis, dist is a distance value, and σ is a softness parameter that is used to compute w(dist) using the following equation:

$$w(dist) = \text{sign}(dist) e^{\frac{-min(|dist|-\delta,0)^2}{2\sigma^2}} \quad \text{Equation 3}$$

Once the net penalty force is computed in step 460, in step 462, the net penalty force is applied to the scene. In step 465, the scene is rendered to produce a frame and in step 470 the frame is displayed. In step 475, the application program 112 determines if the scene has changed in manner that necessitates recomputation of the depth cubemap. For example, the camera position may have changed or an object in the scene may have moved, changed geometrically, been inserted, or been deleted. If, in step 475 the application program 112 determines that the scene has changed in a manner that necessitates recomputation of the depth cubemap, then the application program 112 returns to step 440. Otherwise, in step 477 the application program 112 determines if the scene needs to be rendered due to a non-geometric change, e.g., color, texture, lighting, and the like. If, in step 477 the application program 112 determines that the scene does not need to be rendered, then the application program 112 returns to step 470 to display the same frame. Otherwise, the application program 112 returns to step 465.

The collision detection threshold δ may be modulated as the scale changes. However, there may still be cases when the collision detection threshold is too large and prevents the camera from navigating through small holes. A solution to this problem is described in conjunction with FIGS. 6C and 6D. Additionally, the collision avoidance technique shown in FIGS. 4A and 4B may be used to avoid collisions between one or more geometric objects in a scene in addition to or instead of avoiding collisions with the camera. For example, the collision avoidance technique may be used for modeling and rendering particle systems. A collision detection threshold may be determined for multiple geometric objects in a scene, where one or more of the geometric objects have different collision detection thresholds.

Dynamic Viewing Frustum

Environments that include geometric objects distributed across a wide range of distance values present unique problems for viewport clipping. Due to the limited numerical precision of the depth buffer (typically 32-bit or lower) when static values are used for the near and far plane distances of the viewing frustum, undesirable clipping may result since the numerical precision of the depth buffer is not able to accommodate the wide range of distance values with adequate accuracy. In particular, objects near the camera may be clipped out of the scene or object far from the camera may be clipped out of the scene. Visual artifacts may be observed as objects flicker in and out of frames. To avoid this undesirable clipping and associated visual artifacts, the near and far plane distances of the viewing frustum are dynamically modified based on the minimum distance between the camera and a geometric object in the scene. This minimum distance may be provided by the depth cubemap or another technique.

Figure 5A:
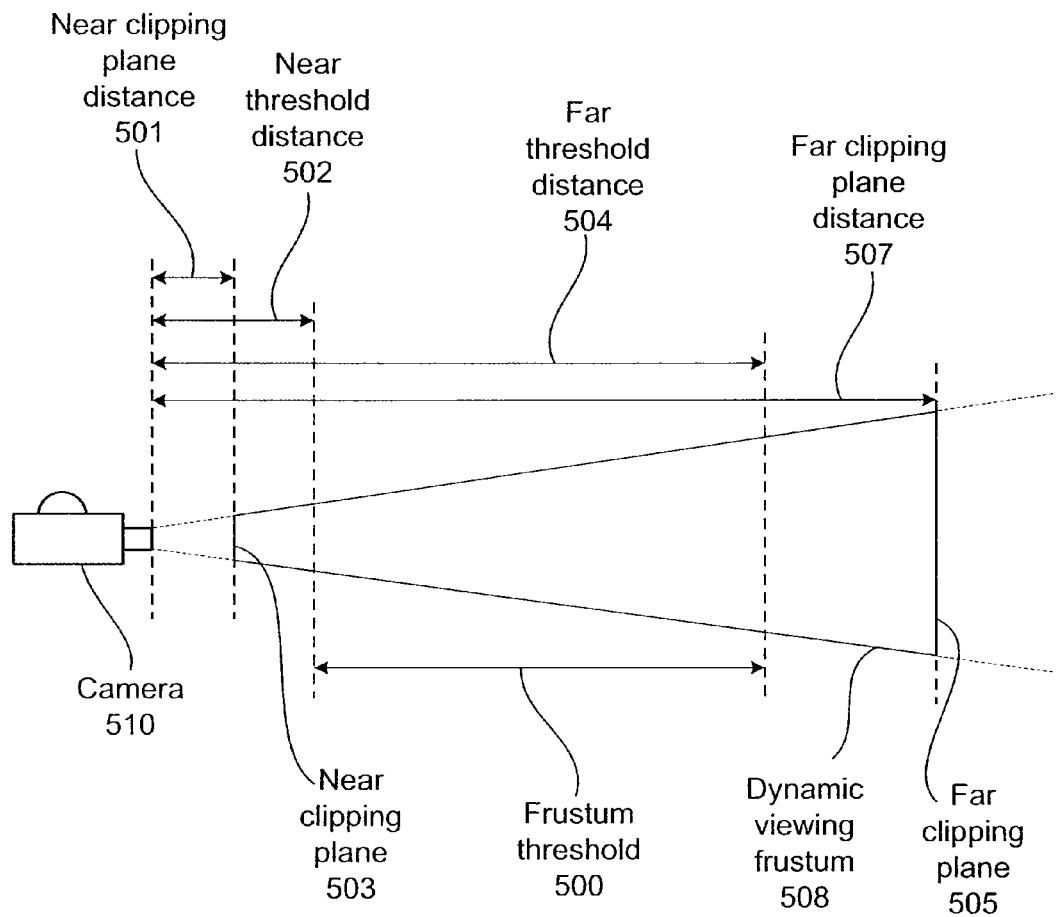
FIG. 5A illustrates the camera, a dynamic viewing frustum, and threshold parameters, according to one embodiment of the invention.

FIG. 5A illustrates the camera 510, a dynamic viewing frustum 508, and frustum threshold parameters, e.g., a near threshold distance 502, a far threshold distance 504, and a frustum threshold 500, according to one embodiment of the invention. The viewing frustum 508 is bounded by a far clipping plane 505 and a near clipping plane 503. The far clipping plane 505 is positioned at a far clipping plane distance 507 from the camera 510 and the near clipping plane 503 is positioned at a near clipping plane distance 501 from the camera 510. The frustum threshold 500 is positioned within the dynamic viewing frustum 508 and is bounded by the near threshold distance 502 and the far threshold distance 504.

The minimum and/or maximum distance values provided by the depth cubemap may be used to select optimal distances for the near and far clipping planes of the viewing frustum 508. This approach positions the dynamic viewing frustum 508 to encompass the visible scene geometry by comparing the distance values to the near threshold distance 502 and far threshold distance 504. As the camera 510 moves around the scene, the near clipping plane 503 and the far clipping plane 505 are dynamically updated to contain the changing minimum and/or maximum distances. In addition, if the normalized minimum distance stored in the depth cubemap for the scene is 1.0, indicating that no geometry was rendered to the depth cubemap, then the near clipping plane distance 501 and/or far clipping plane distance 507 are modified to "search" for a geometric object in the scene.

Figure 5B:
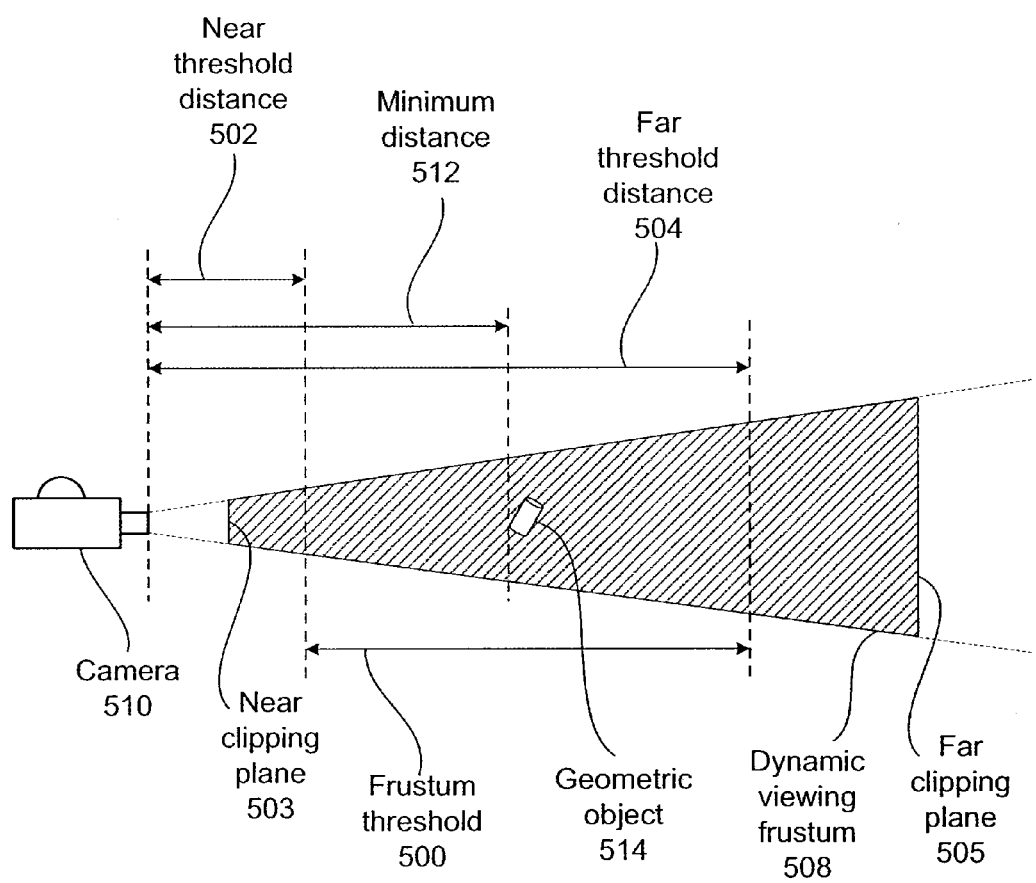
FIG. 5B illustrates the camera, a geometric object within the dynamic viewing frustum, and threshold parameters, according to one embodiment of the invention.

FIG. 5B illustrates the camera 510, a geometric object 514 that lies within the dynamic viewing frustum 508, and frustum threshold parameters, according to one embodiment of the invention. A minimum distance 512 is the non-normalized minimum distance value (cubeMinDist) of the distance values that are stored in the depth cubemap for the scene. The minimum distance 512 corresponds to a geometric object 514 that lies within the frustum threshold 500. Since the minimum distance 512 lies between the near threshold distance 502 and the far threshold distance 504, the dynamic viewing frustum 508 remains unchanged.

Figure 5C:
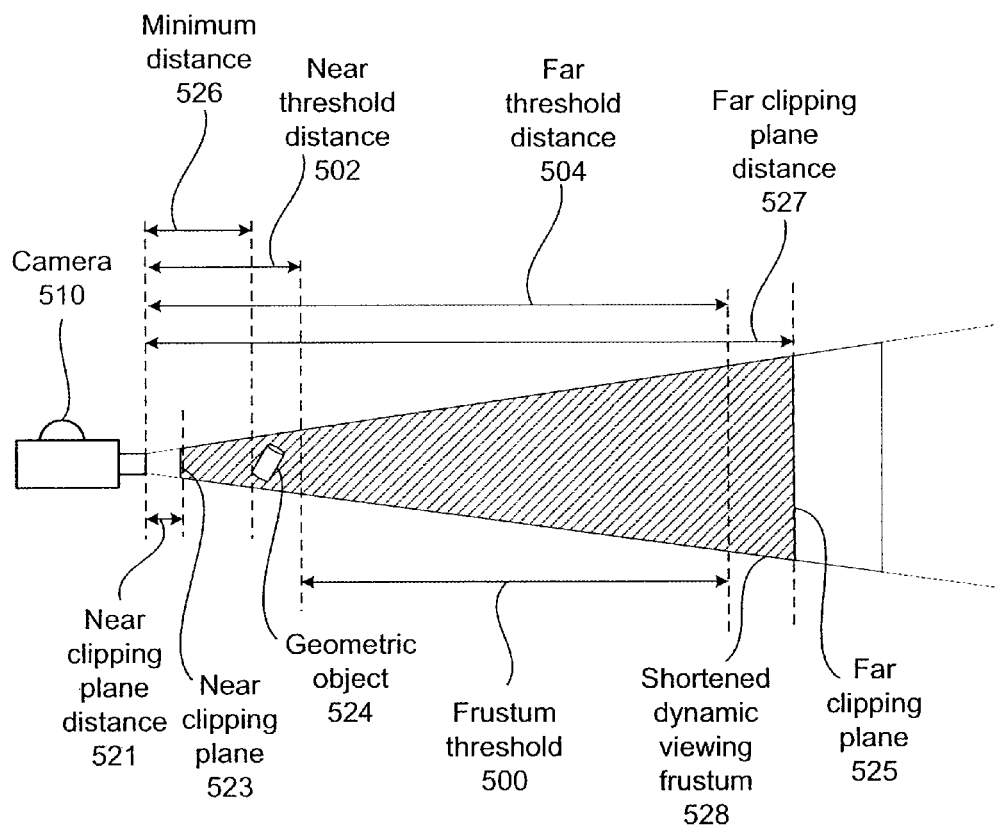
FIG. 5C illustrates the camera, a shortened dynamic viewing frustum, and threshold parameters, according to one embodiment of the invention.

FIG. 5C illustrates the camera 510, a shortened dynamic viewing frustum 528, and threshold parameters, according to one embodiment of the invention. A minimum distance 526 is the non-normalized minimum distance value (cubeMinDist) of the distance values that are stored in the depth cubemap for the scene. The minimum distance 526 corresponds to a geometric object 524 that lies outside of the frustum threshold 500. The dynamic viewing frustum 528 is shortened compared with the dynamic viewing frustum 508 shown in FIGS. 5A and 5B.

In order to position the shortened dynamic view frustum 528 to avoid undesirable clipping of geometric object 524 by the near clipping plane, a shortened dynamic viewing frustum 528 is shifted closer to the camera 510 compared with the dynamic viewing frustum 508 shown in FIGS. 5A and 5B. The dynamic viewing frustum is shortened when the minimum distance 526 is less than the near threshold distance 502. Similarly, near clipping plane distance 521 and far clipping plane distance 527 are also shifted closer to the camera 510 compared with near clipping plane distance 501 and far clipping plane distance 507, respectively, shown in FIGS. 5A and 5B. Shifting the far clipping plane 525 closer to the camera allows for more accurate distance values since the distance values represented by the limited number of bits lie within a smaller range compared with only shifting the near clipping plane 523 closer to the camera 510. The far clipping plane distance 527 may be determined by scaling the near clipping plane distance 521. Frustum threshold 500 may vary based on the scale of the scene or the distribution of distance values stored in the depth cubemap.

Figure 5D:
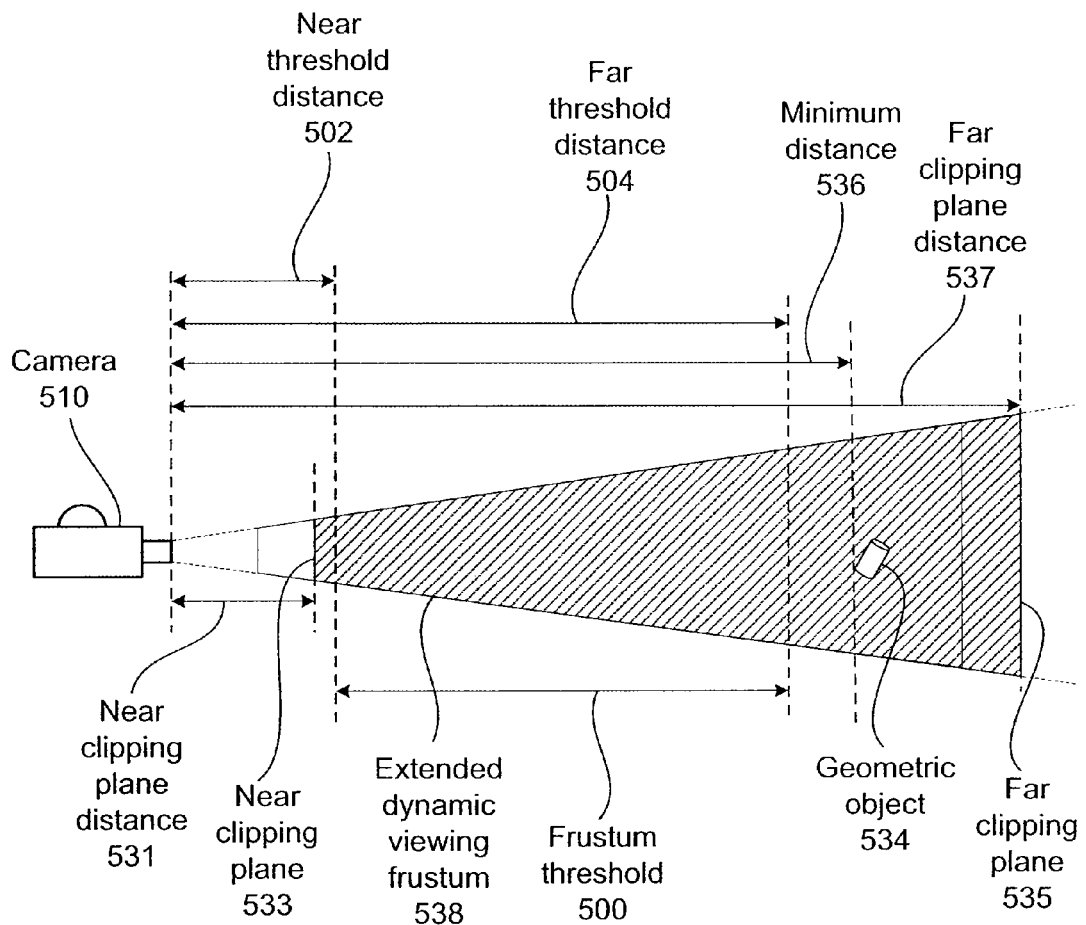
FIG. 5D illustrates the camera, an extended dynamic viewing frustum, and threshold parameters, according to one embodiment of the invention.

FIG. 5D illustrates the camera 510, an extended dynamic viewing frustum 538, and threshold parameters, according to one embodiment of the invention. A minimum distance 536 is the non-normalized minimum distance value (cubeMinDist) of the distance values that are stored in the depth cubemap for the scene. The minimum distance 536 corresponds to a geometric object 534 that lies outside of frustum threshold 500. The dynamic viewing frustum 538 is extended compared with the dynamic viewing frustum 508 shown in FIGS. 5A and 5B.

In order to position the extended dynamic viewing frustum 538 to avoid undesirable clipping of geometric object 534 by the near clipping plane, the extended dynamic viewing frustum 538 is shifted further from the camera 510 compared with the dynamic viewing frustum 508 shown in FIGS. 5A and 5B. The dynamic viewing frustum is extended when the minimum distance 536 is greater than the far threshold distance 504. Similarly, near clipping plane distance 531 and far clipping plane distance 537 are also shifted further from the camera 510 compared with near clipping plane distance 501 and far clipping plane distance 507, respectively, shown in FIGS. 5A and 5B. Shifting the near clipping plane 533 further from the camera allows for more accurate distance values since the distance values represented by the limited number of bits lie within a smaller range compared with only shifting the far clipping plane 535 further from the camera 510. The far clipping plane distance 537 may be determined by scaling the near clipping plane distance 531.

Figure 5E:
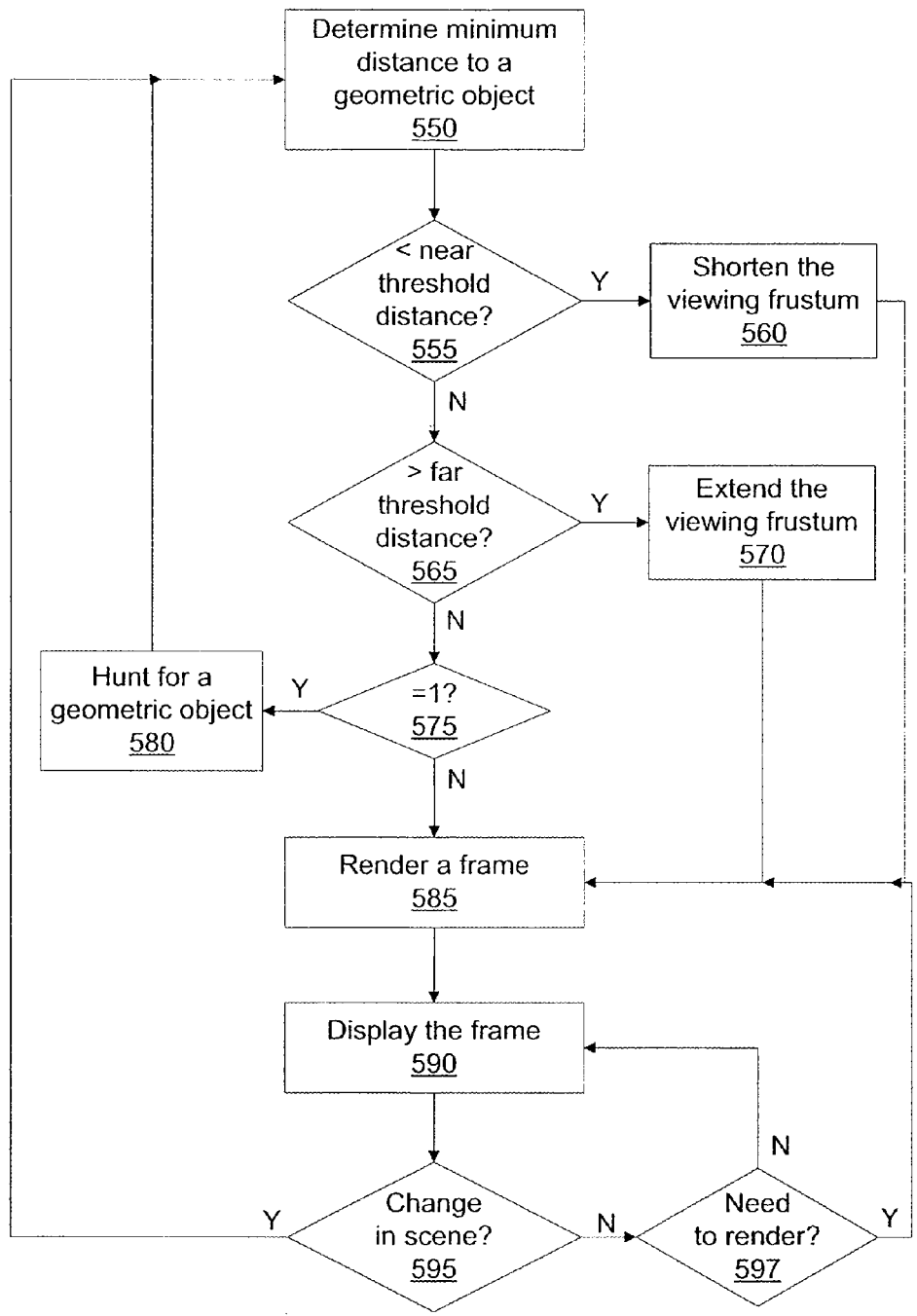
FIG. 5E is a flow diagram of method steps for determining the dynamic viewing frustum, according to one embodiment of the invention.

FIG. 5E is a flow diagram of method steps for determining the dynamic viewing frustums 508, 528, and 538, according to one embodiment of the invention. Although the method steps are described in conjunction with the system of FIG. 1, persons skilled in the art will understand that any system configured to perform the method steps, in any order, is within the scope of the invention.

The method begins in step 550, where a minimum distance from the camera 510 to a geometric object in a scene (minimum distance) is determined by the application program 112. The minimum distance may be determined using the depth cubemap or using distance values acquired using a different technique. In step 555 the application program 112 determines if the minimum distance is less than the near threshold distance 502. If the minimum distance is less than the near threshold distance 502, then in step 560 the dynamic viewing frustum is shortened before a frame is rendered in step 585.

The near plane distance, n, is updated to an to shorten the dynamic viewing frustum. A value of 0.75 for αn was found to produce satisfactory results when the near threshold distance 502 is 2 and the far threshold distance 504 is 10, assuming that the far plane distance is clamped for unreasonably large values and the near plane distance is clamped for unreasonable small values.

If in step 555 the application program 112 determines that the minimum distance is not less than the near threshold distance 502, then in step 565 the application program 112 determines if the minimum distance is greater than the far threshold distance 504. If the minimum distance is greater than the far threshold distance 504, then in step 570 the dynamic viewing frustum is extended before a frame is rendered in step 585.

To extend the dynamic viewing frustum, the near plane distance, n, is updated to βn. A value of 1.5 for βn was found to produce satisfactory results when the near threshold distance 502 is 2 and the far threshold distance 504 is 10, assuming that the far plane distance is clamped for unreasonably large values and the near plane distance is clamped for unreasonable small values.

If, in step 555 the application program determines that the minimum distance is not greater than the far threshold distance 504, then, in step 575 the application program 112 determines if the minimum distance equals one, indicating that no geometry exists within the dynamic viewing frustum. If no geometry exists within the dynamic viewing frustum, in step 580 the application program 112 "hunts" for a geometric object in the scene by increasing or decreasing the near and far clipping plane distances from the camera 510 and returns to step 550. If, in step 575 the minimum distance is not equal to one, then the dynamic viewing frustum is unchanged, and in step 585 the scene is rendered using the dynamic viewing frustum to produce a frame. In step 590 the frame is displayed.

In step 595, the application program 112 determines if the scene has changed in manner that may necessitate repositioning of the dynamic viewing frustum. For example, the camera position may have changed or an object in the scene may have moved, changed geometrically, been inserted, or been deleted. If, in step 595 the application program 112 determines that the scene has changed in a manner that may necessitate repositioning of the dynamic viewing frustum, then the application program 112 returns to step 550. Otherwise, in step 597 the application program 112 determines if the scene needs to be rendered due to a non-geometric change, e.g., color, texture, lighting, and the like. If, in step 597 the application program 112 determines that the scene does not need to be rendered, then the application program returns to step 590 to display the same frame. Otherwise, the application program 112 returns to step 585.

In one embodiment, the end user may define the frustum parameters, e.g., near threshold distance 502, far threshold distance 504, αn, βn, and C using a graphical user interface (GUI) associated with the application program 112 of FIG. 1. Persons skilled in the art will recognize that a drag-and-drop scheme for defining associations may provide an intuitive and efficient entry means for users. Although steps 555 and 565 compare the minimum distance to the near and far threshold distances, in other embodiments of the invention, the furthest distance of the values stored in the depth cubemap may be compared with the near and far threshold distances to determine whether or not the dynamic viewport frustum is shortened, extended, or unchanged.

When the scale of the scene environment is varies greatly, such as when navigating the Earth, prior knowledge of the structure of the scene (a sphere with much smaller objects embedded on the surface), the far clipping plane distance may be defined as the length of a tangent line from the camera to the sphere. However, the problem with such an ad-hoc assignment is that it does not work at all scales. In particular, as the camera approaches the Earth's surface, the result is unacceptable. By comparison, the dynamic viewing frustum technique is robust, working both far from the Earth and close-in. Advantageously, the dynamic viewing frustum technique does not require prior knowledge of the object geometry in the scene, making it a general, multiscale approach for managing the viewing frustum.

Multiscale 3D Navigation Modes

Simple mouse-based controls may be used to navigate through complex environments and also to fly around geometric objects to inspect them. The camera may operate in several fairly distinct scales in an environment including the Earth, e.g., orbit-level, city-level, neighbourhood-level, and building interior-level. An end user may interact with the environment using various system components to aid in navigation. Example system components that are supported by the application program 112 include a look & fly mode, a push-out mode, a hovercam mode, and a framed zoom mode.

In some embodiments of the present invention, the look & fly mode is initiated by clicking the left mouse button. In particular, clicking the left mouse button initiates a fly towards the intersection with geometry under the mouse cursor (destination target). Subsequent left mouse button clicks retarget the fly. While in flying mode, moving the mouse around the viewport allows the end user to look around the scene while still following the original fly trajectory. To break flying mode, an end user clicks the right mouse button. When stationary, a left mouse button drag initiates a HoverCam mode, allowing the end user to perform exocentric inspection of geometry in the scene. Conversely, a right mouse button drag performs an egocentric look operation. A right mouse button click initiates the push-out mode, where the collision detection spheres around the camera expand, forcing the camera out and away from geometry in the scene. A single left mouse button click cancels push-out mode. Finally, holding the shift key while dragging with the left mouse button allows the end user to perform a framed zoom-in on scene geometry.

The look & fly navigation technique allows the end user to travel through the scene at a scale-dependent rate, while avoiding collisions with obstacles. The end user is able to freely change the viewing direction of the camera with the mouse during flight. The centre of the display screen acts as a "deadzone", a small area in which if the mouse is present, the viewing direction will not change. When the mouse leaves the deadzone, the cursor's direction from the centre of the display screen defines the angle in which the camera's view direction rotates. The distance of the cursor from the deadzone controls the rate of rotation. Persons skilled in the art will understand that any suitable input device may be used in place or in addition to a keyboard and/or mouse.

Figure 6A:
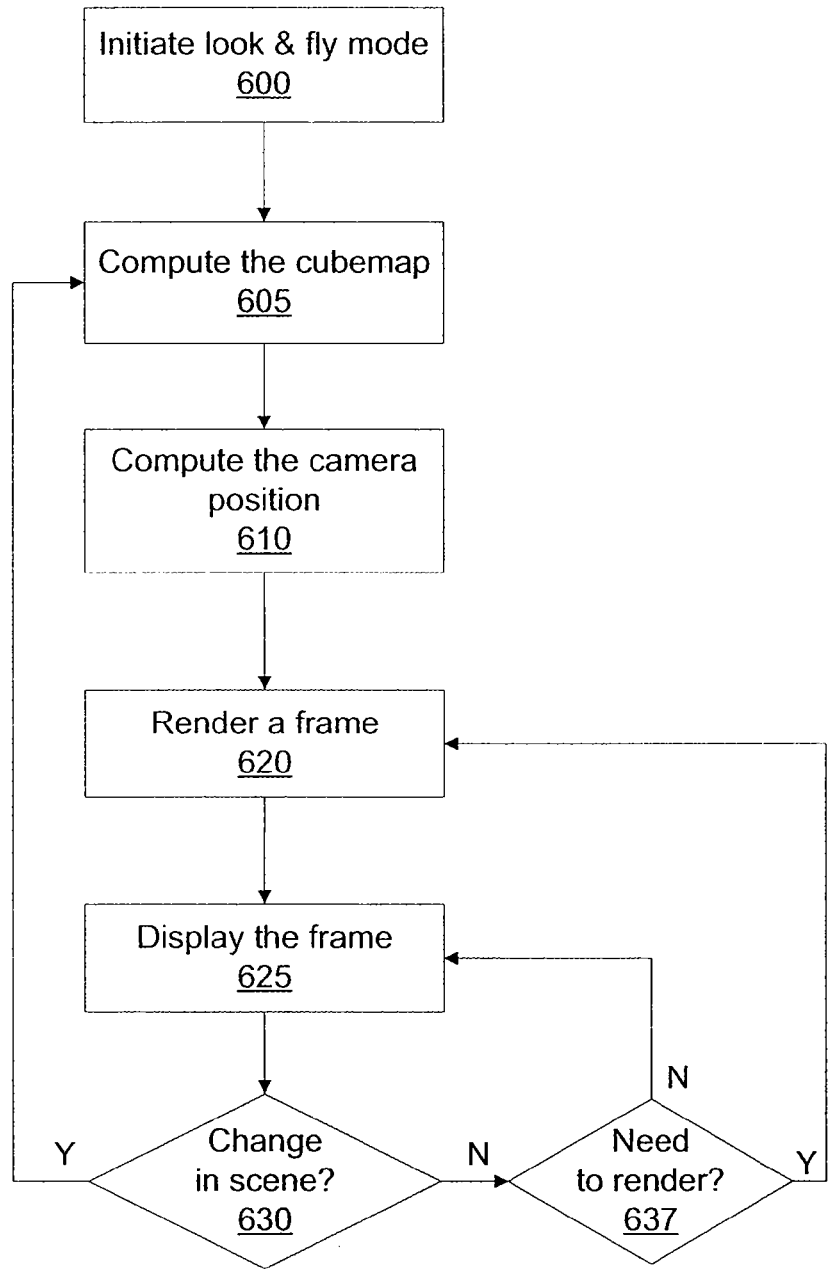
FIG. 6A is a flow diagram of method steps for rendering frames when a look & fly navigation mode is used, according to one embodiment of the invention.

FIG. 6A is a flow diagram of method steps for rendering frames when a look & fly navigation mode is used, according to one embodiment of the invention. Although the method steps are described in conjunction with the system of FIG. 1, persons skilled in the art will understand that any system configured to perform the method steps, in any order, is within the scope of the invention. The method begins at step 600 with an end user initiating the look & fly mode. In step 605 the depth cube map is computed if it isn't already available. In step 610 the camera position is computed.

As previously explained, the destination target for the flight is set to the current 3D cursor position, $p_{Cursor}$, which remains fixed. During flight the following function is used to displace the camera position, $p_{Cam}$ over a time interval $t_\Delta$ between frame updates:

$$p_{Cam} = p_{Cam} + (p_{Cursor} - p_{Cam}) \cdot t_\Delta \cdot \left(\frac{cubeDistMin}{2}\right). \quad \text{Equation 4}$$

cubeDistMin is the (non-normalized) distance of the closest geometry in the scene, provided by the cubemap or provided using another technique. Scaling the speed of flying based on the distance of nearby geometry provides a consistent sense of speed when navigating between different scales.

In step 620 the scene is rendered to produce a frame, and in step 625 the frame is displayed. In step 630, the application program 112 determines if the scene has changed in manner that necessitates recomputation of the depth cubemap. For example, the camera position may have changed or an object in the scene may have moved, changed geometrically, been inserted, or been deleted. If, in step 630 the application program 112 determines that the scene has changed in a manner that necessitates recomputation of the depth cubemap, then the application program 112 returns to step 605. Otherwise, in step 637 the application program 112 determines if the scene needs to be rendered due to a non-geometric change, e.g., color, texture, lighting, and the like. If, in step 637 the application program 112 determines that the scene does not need to be rendered, then the application program returns to step 625 to display the same frame. Otherwise, the application program 112 returns to step 620.

Figure 6B:
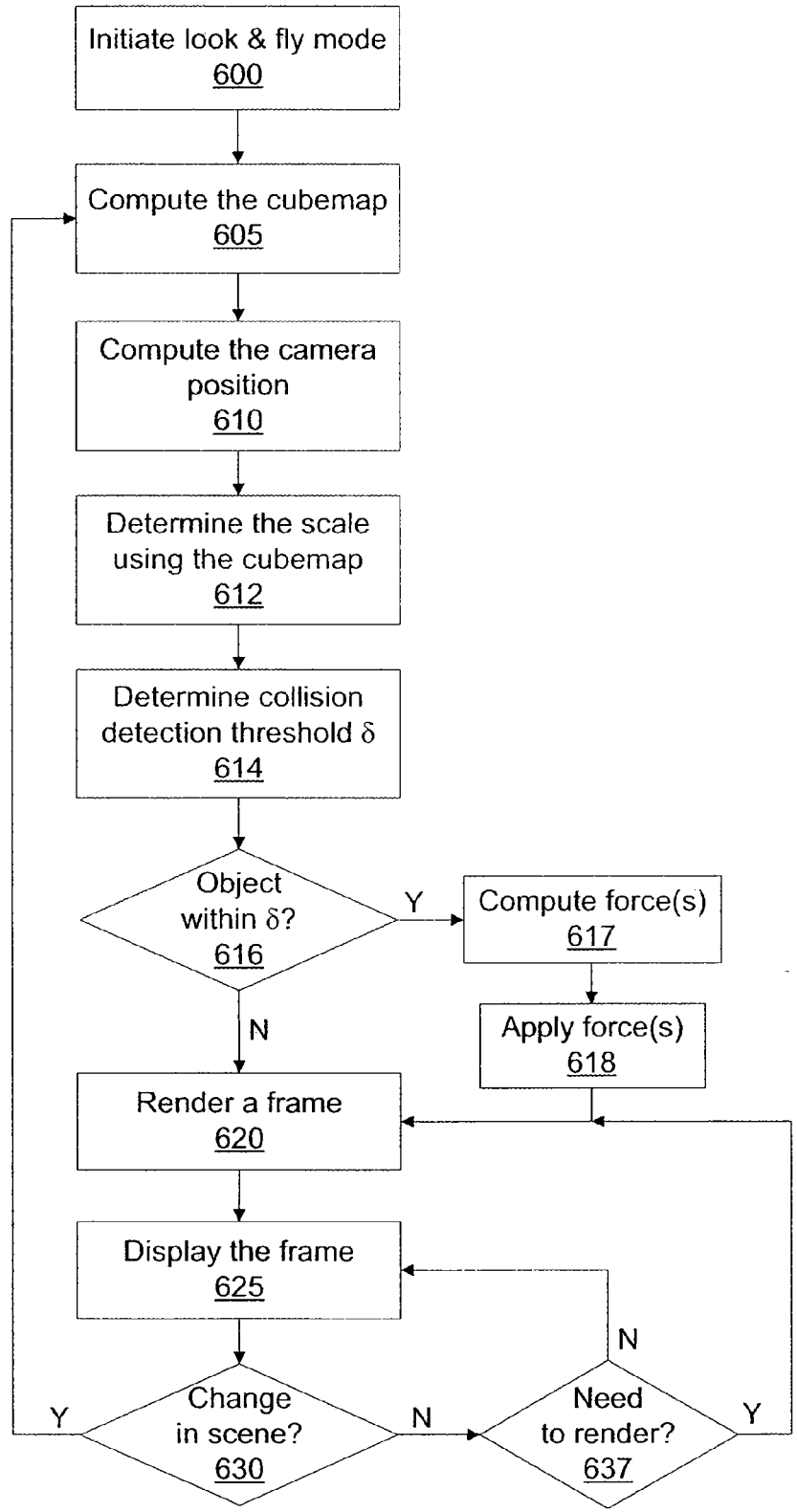
FIG. 6B is a flow diagram of method steps for rendering frames when a look & fly navigation mode is used with collision detection, according to one embodiment of the invention.

FIG. 6B is a flow diagram of method steps for rendering frames when a look & fly navigation mode is used with scale detection and collision avoidance, according to one embodiment of the invention. Although the method steps are described in conjunction with the system of FIG. 1, persons skilled in the art will understand that any system configured to perform the method steps, in any order, is within the scope of the invention. The method begins with previously described steps 600, 605, and 610. In step 612 the scale is determined. In step 612, the application program 112 determines the scale of the scene using the depth cubemap or distance values acquired using a different technique.

When flying, the depth cubemap is also used to perform collision detection within the scene. Because of this, the path of flight will not always be a straight line from start to finish since the camera will avoid obstacles that enter its local vicinity. In fact, because of collision avoidance, the camera will never reach the destination target specified by $p_{Cursor}$. Instead, the camera will be repelled once the destination target is within the collision sphere defined by the collision detection threshold $\delta$. The collision detection threshold is assigned a new value when flying is initiated, that is based on the distance from start to finish. In step 614, the application program 112 determines the collision detection threshold $\delta$ for the camera. In some embodiments of the present invention, $\delta$ is computed using the following equation:

$$\delta = \frac{\|p_{Cursor} - p_{Cam}\|}{4} \quad \text{Equation 5}$$

In step 616, the application program 112 determines if any of the distance values stored in the depth cubemap are within the collision detection threshold. If, in step 616 the application program 112 determines that no distance values are within the collision detection threshold, then the application program 112 proceeds directly to step 620. Otherwise, one or more distance values are within the collision detection threshold and in step 617 the net penalty force is determined and in step 618, the net penalty force is applied to the scene.

In step 620, the scene is rendered to produce a frame and in step 625 the frame is displayed. In step 630, the application program 112 determines if the scene has changed in manner that necessitates recomputation of the depth cubemap, and, if so, the application program 112 returns to step 605. Otherwise, in step 637 the application program 112 determines if the scene needs to be rendered due to a non-geometric change, e.g., color, texture, lighting, and the like. If, in step 637 the application program 112 determines that the scene does not need to be rendered, then the application program returns to step 625 to display the same frame. Otherwise, the application program 112 returns to step 620.

As a complement to look & fly navigation, a push-out technique is available to perform the opposite behaviour, i.e., to move the camera away from the geometric objects in the scene. In contrast with the look & fly mode, a destination target is not specified in the push-out mode. Moving the camera to a position away from the objects in the scene where the camera has a perspective of a larger scale has a trivial solution in the case of Earth navigation. The camera is simply moved further from the Earth's centre. However, the ability to navigate within structures as well as at a planetary scale is a key component of multiscale 3D navigation. The simple approach of translating the camera away from the Earth will potentially penetrate the roof of a structure, resulting in a camera path that is unnatural. Furthermore, translating the camera away from the Earth does not provide a behaviour that is consistent between different scales.

Therefore, the nearest exit point is used to guide the camera when the camera is inside a structure. When the end user right clicks the mouse to initiate the push-out navigation mode, the collision detection threshold, $\delta$ is dilated. In some embodiments of the present invention, $\delta = 3.0*\text{cubeMinDist}$. In the case of the camera being enclosed by scene geometry, the camera begins flying toward an exit point, such as a doorway or window.

Figure 6C:
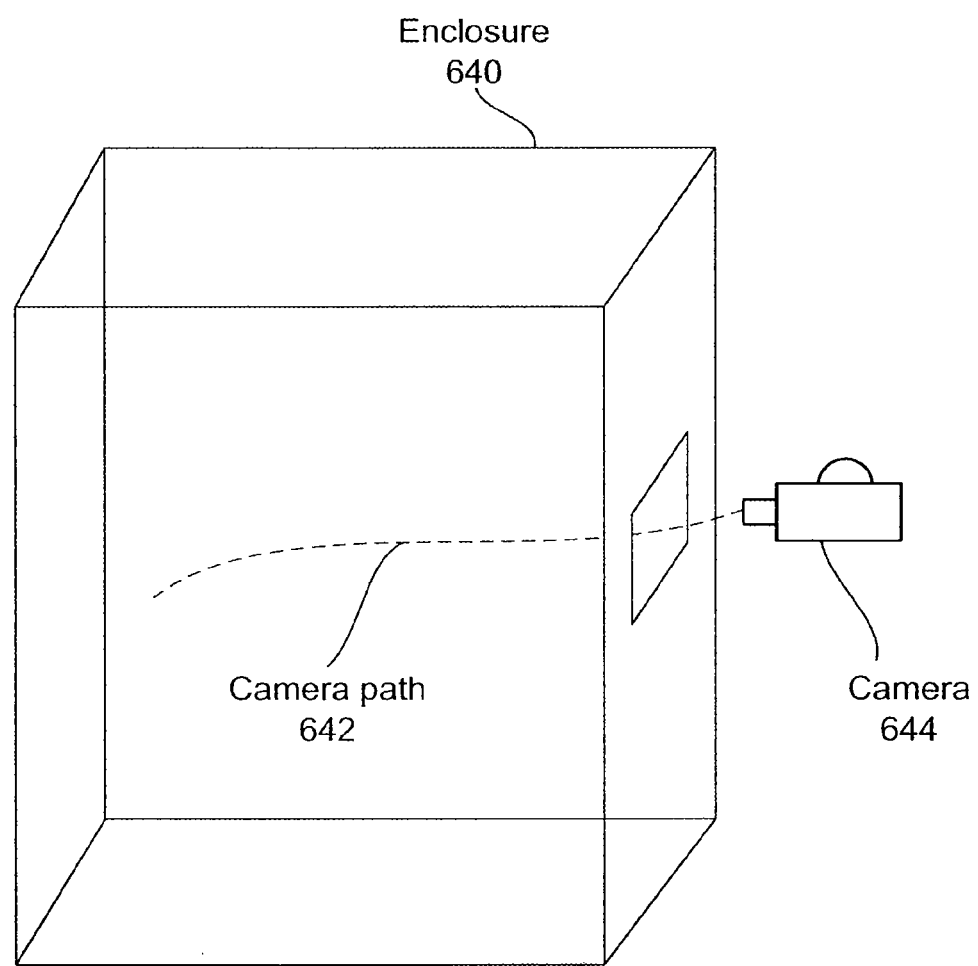
FIG. 6C illustrates the push-out navigation technique, according to one embodiment of the invention.

FIG. 6C illustrates the push-out 3D navigation technique, according to one embodiment of the invention. When the push-out navigation mode is initiated by the end user, the camera 644 follows the camera path 642 towards the opening in the enclosure 640 to exit the enclosure 640. As the camera 644 passes through the opening, the scale adapts to the change in the environment since the distance values from the camera 644 have increased. Conversely, when the camera 644 enters the enclosure 640 the scale adapts to a finer scale to allow the end user to inspect the interior of the enclosure 640 as the distance values from the camera 644 decrease.

In the case of the camera 644 being exterior to the enclosure 640, as is the case when orbiting the Earth, or viewing a city from above, the camera 644 moves in a direction generally away from the enclosure 640 while the push-out navigation mode is engaged. Whether the camera 644 is inside of the enclosure 640 or outside of the enclosure 640, the camera 644 moves in a natural way, seamlessly transitioning the end user between different scales. The technique of dilating the collision detection threshold for the push-out 3D navigation mode is reliable in producing simple motion paths where an exit point is observable from the camera's current position.

Figure 6D:
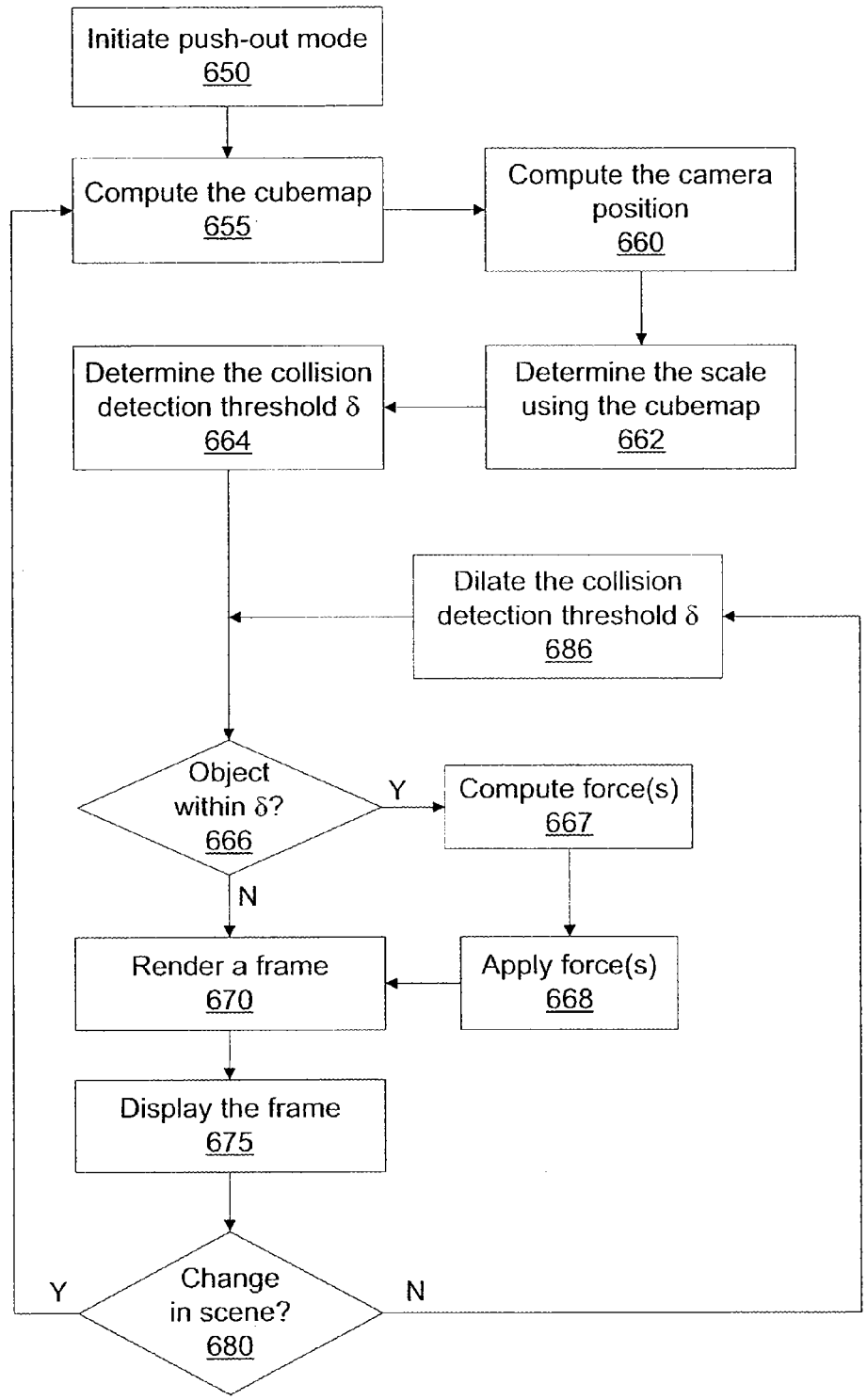
FIG. 6D is a flow diagram of method steps for rendering frames when the push-out navigation technique is used, according to one embodiment of the invention.

FIG. 6D is a flow diagram of method steps for rendering frames when the push-out navigation technique is used, according to one embodiment of the invention. Although the method steps are described in conjunction with the system of FIG. 1, persons skilled in the art will understand that any system configured to perform the method steps, in any order, is within the scope of the invention. The method begins with step 650 with an end user initiating the push-out navigation mode. In step 655 the depth cube map is computed if it isn't already available. In step 660 the camera position is computed. In step 662 the scale is determined. In step 662, the application program 112 determines the scale of the scene using the depth cubemap or distance values acquired using a different technique.

In step 664, the application program 112 determines the dilated collision detection threshold δ for the camera. In some embodiments of the present invention, the dilated collision detection threshold, δ=3.0*cubeMinDist. In step 666, the application program 112 determines if any of the distance values stored in the depth cubemap are within the dilated collision detection threshold. If, in step 666 no distance values are within the collision detection threshold, then the application program 112 proceeds directly to step 670. Otherwise, in step 667 the application program 112 computes a weighted sum of forces for one or more distance values to produce a net penalty force. In step 668, the net penalty force is applied to the scene.

In step 670, the scene is rendered to produce a frame and in step 675 the frame is displayed. In step 680, the application program 112 determines if the scene has changed in manner that necessitates recomputation of the depth cubemap, and, if so, the application program 112 returns to step 655. Otherwise, the scene has not changed and the camera has not progressed towards the destination point. In order to allow the camera to progress towards the destination point while avoiding collisions, the collision detection threshold is dilated in step 686. Once progress is made, the collision detection threshold may be undilated.

The hovercam navigation mode is used for proximal object inspection by constraining the camera position based on the closest distance of an object. The depth cubemap may be used to identify the closest distance without explicitly testing the geometry of the object. The depth cubemap may also be used to avoid collisions and determine a smooth camera path. In order to maintain smooth camera motion while operating in the hovercam navigation mode, the distance values in the depth cubemap that are less than one (corresponding to actual geometry) are filtered.

The end user performs hovercam behaviour by dragging the left mouse button on a particular scene object. Just the scene object selected is rendered into the depth cubemap in order to find the closest point to the camera. This approach avoids the issue of the camera switching between viewing the object of interest, and another separate object in the scene which may be closer to the camera. For example, consider examining the base of a town (the object of interest), it would be undesirable to suddenly switch the view to the Earth immediately below the camera. While only the object of interest is rendered to produce the depth cubemap, collision detection may be performed by rendering a second depth cubemap including all of the objects within the combined dynamic viewing frustums.

The framed zoom navigation mode allows the end user to specify a particular region of the scene that they would like to see from a closer viewpoint. The framed zoom navigation mode may be initiated by holding the shift key while performing a left-click drag with the mouse to frame (select) a region of the scene. When the mouse is released, the camera animates to a new position that corresponds to a view containing the selected region. The extent in which the camera zooms in is determined by the circular frame. The radius of the circular frame is determined by projecting a ray from the current mouse position through the plane defined by the position and normal vector of the 3D cursor. The circular frame may appear as a stencil, darkening areas of the scene that will not be visible when rendered to present the closer viewpoint.

If $p_{Cursor}$ and $n_{Cursor}$ are the position and normal of the 3D cursor, the circular frame has a radius r, and the horizontal and vertical FOVs of the camera are $\Theta_H$ and $\Theta_V$, the new camera position $p_{Cam}$ is given by the following equation:

$$p_{Cam} = p_{Cursor} + n_{Cursor} \frac{r}{\sqrt{2} \min(\tan\theta_H, \tan\theta_V)}, \quad \text{Equation 6}$$

and the camera will be oriented to look at $p_{Cursor}$.

In sum, a technique is disclosed for providing users of software application programs with a seamless navigation system for highly multiscale 3D datasets. The adaptive multiscale 3D navigation system allows an end user to transition between a planetary scale down to an individual building scale. The size of the environment is sensed automatically and the viewing and travel parameters are adjusted accordingly to provide the end user with a seamless navigation experience. The end user workflow is simplified and more intuitive, thereby improving the overall end user experience.

An image-based environment representation, depth cubemap may be computed for the scene to provide distance value data. The depth cubemap or distance values obtained using another technique, may be used for robust scale detection, smooth collision detection and avoidance, and enabling a dynamic viewing frustum that is used to the scene. Proxy objects may be used in place of the actual geometric objects to improve performance. The look & fly and push-out navigation modes use the scale detection and collision avoidance techniques to enable an end user to navigate through complex environments and inspect individual objects, regardless of the object's size, shape, or scale.

While the forgoing is directed to embodiments of the present invention, other and further embodiments of the invention may be devised without departing from the basic scope thereof. For example, aspects of the present invention may be implemented in hardware or software or in a combination of hardware and software. One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the present invention, are embodiments of the present invention.

In view of the foregoing, the scope of the present invention is determined by the claims that follow.

We claim:

1. A computer-implemented method for providing a multiscale three-dimensional (3D) navigation environment, the method comprising:
   obtaining a set of distance values indicating distances between a camera and at least one closest fragment associated with one or more geometric objects in a 3D scene environment;
   replacing a geometric object in the 3D scene environment with a proxy object that has a lower resolution than the geometric object;
   generating a depth map that stores the set of distance values based on the proxy object;
   computing a scale for the 3D scene environment based on the set of distance values, wherein the scale indicates a relationship between a control unit of the 3D scene environment and a display unit of a rendered frame;
   rendering the 3D scene environment as viewed from the camera to produce a rendered frame; and
   storing the rendered frame in a memory or displaying the rendered frame on a display device.

2. The method of claim 1, wherein the depth map comprises a depth cubemap.

3. The method of claim 2, further comprising the steps of:
   determining that the camera has changed position within the 3D scene environment; and
   repeating the steps of generating the depth cubemap, computing the scale, and rendering the 3D scene environment based on the changed position.

4. The method of claim 2, further comprising the steps of:
   determining that a geometric object within the 3D scene environment has been modified; and
   repeating the steps of generating the depth cubemap, computing the scale, and rendering the 3D scene environment based on the modified geometric object.

5. The method of claim 2, wherein the step of generating the depth cubemap comprises rendering the 3D scene environment at a lower pixel resolution relative to a pixel resolution associated with the rendered frame.

6. The method of claim 1, further comprising the step of determining a collision detection threshold.

7. The method of claim 6, further comprising the steps of:
   determining that one or more of the distance values in the set of distance values are within the collision detection threshold;
   computing a net penalty force for the one or more distance values that are within the collision detection threshold; and
   applying the net penalty force in the 3D scene environment.

8. The method of claim 1, further comprising the steps of:
   determining that the camera has changed position within the 3D scene environment; and
   repeating the steps of obtaining the set of distance values, computing the scale, and rendering the 3D scene environment based on the changed position.

9. The method of claim 1, further comprising the steps of:
   determining that a geometric object within the 3D scene environment has been modified; and
   repeating the steps of obtaining the set of distance values, computing the scale, and rendering the 3D scene environment based on the modified geometric object.

10. A non-transitory computer-readable medium including instructions that, when executed by a processing unit, cause the processing unit to provide a multiscale three-dimensional (3D) navigation environment, by performing the steps of:
    obtaining a set of distance values indicating distances between a camera and at least one closest fragment associated with one or more geometric objects in a 3D scene environment;
    replacing a geometric object in the 3D scene environment with a proxy object that has a lower resolution than the geometric object;
    generating a depth map that stores the set of distance values based on the proxy objects;
    computing a scale for the 3D scene environment based on the set of distance values, wherein the scale indicates a relationship between a control unit of the 3D scene environment and a display unit of a rendered frame;
    rendering the 3D scene environment as viewed from the camera to produce a rendered frame; and
    storing the rendered frame in a memory or displaying the rendered frame on a display device.

11. The non-transitory computer-readable medium of claim 10, wherein the depth map comprises a depth cubemap.

12. The non-transitory computer-readable medium of claim 10, further comprising the steps of:
    determining that the camera has changed position within the 3D scene environment; and
    repeating the steps of obtaining the set of distance values, computing the scale, and rendering the 3D scene environment based on the changed position.

13. The non-transitory computer-readable medium of claim 11, further comprising the steps of:
    determining that a geometric object within the 3D scene environment has been modified; and
    repeating the steps of generating the depth cubemap, computing the scale, and rendering the 3D scene environment based on the modified geometric object.

14. A computer-implemented method for performing collision avoidance in a multiscale three-dimensional (3D) navigation environment, the method comprising:
    obtaining a set of distance values indicating distances between a camera and at least one closest fragment associated with one or more geometric objects in a 3D scene environment;
    computing a collision detection threshold for the 3D scene environment;
    determining that one or more of the distance values in the set of distance values are within the collision detection threshold; and
    computing a net penalty force for the one or more distance values are within the collision detection threshold;
    applying the net penalty force in the 3D scene environment;
    rendering the 3D scene environment as viewed from the camera to produce a rendered frame; and
    storing the rendered frame in a memory or displaying the rendered frame on a display device.

15. The method of claim 14, further comprising the step of generating a depth cubemap that stores the set of distance values.

16. The method of claim 15, wherein the step of generating the depth cubemap comprises rendering the 3D scene environment at a lower pixel resolution relative to a pixel resolution associated with the rendered frame.

17. The method of claim 14, further comprising the steps of:
    determining that the camera has not moved toward a destination target in the 3D scene environment;
    dilating the collision detection threshold, and
    repeating the steps of determining, computing, applying, and rendering.

18. The method of claim 14, further comprising the step of computing an updated position of the camera based on the set of distance values, the position of the camera, and a position of a destination target in the 3D scene environment.

19. The method of claim 14, wherein the collision detection threshold for the 3D scene environment is computed based on a distance between a destination target and the camera along a path.

20. A computer-implemented method for providing a multiscale three-dimensional (3D) navigation environment, the method comprising:
   obtaining a set of distance values indicating distances between a camera and at least one closest fragment of associated with one or more geometric objects in a 3D scene environment;
   computing a scale for the 3D scene environment based on the set of distance values, wherein the scale indicates a relationship between a control unit of the 3D scene environment and a display unit of a rendered frame;
   determining a collision detection threshold;
   determining that one or more of the distance values in the set of distance values are within the collision detection threshold;
   computing a net penalty force for the one or more distance values that are within the collision detection threshold;
   applying the net penalty force in the 3D scene environment;
   rendering the 3D scene environment as viewed from the camera to produce a rendered frame; and
   storing the rendered frame in a memory or displaying the rendered frame on a display device.

21. The method of claim 1, further comprising replacing the proxy object with the geometric object when the geometric object is close to the camera.

22. The non-transitory computer-readable medium of claim 10, further comprising the step of replacing the proxy object with the geometric object when the geometric object is close to the camera.

23. The non-transitory computer-readable medium of claim 10, further comprising the step of dynamically modifying the scale when a user zooms in or out, such that a speed of the camera slows as a distance to the geometric object is reduced and increases as the distance to the geometric object increases.

24. The method of claim 1, further comprising dynamically modifying the scale when a user zooms in or out, such that a speed of the camera slows as a distance to the geometric object is reduced and increases as the distance to the geometric object increases.

* * * * *